US009076687B2

(12) United States Patent
Lee et al.

(10) Patent No.: US 9,076,687 B2
(45) Date of Patent: Jul. 7, 2015

(54) METHODS OF FORMING SEMICONDUCTOR DEVICES, INCLUDING FORMING PATTERNS BY PERFORMING AN OXIDATION PROCESS

(71) Applicants: Sunghae Lee, Suwon-si (KR); Dongkyum Kim, Suwon-si (KR); Joonsuk Lee, Seoul (KR)

(72) Inventors: Sunghae Lee, Suwon-si (KR); Dongkyum Kim, Suwon-si (KR); Joonsuk Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/288,544

(22) Filed: May 28, 2014

(65) Prior Publication Data

US 2015/0050803 A1 Feb. 19, 2015

(30) Foreign Application Priority Data

Aug. 13, 2013 (KR) .......................... 10-2013-0096083

(51) Int. Cl.
*H01L 27/115* (2006.01)
*H01L 21/28* (2006.01)
*H01L 29/66* (2006.01)

(52) U.S. Cl.
CPC .... *H01L 27/11582* (2013.01); *H01L 21/28273* (2013.01); *H01L 27/1157* (2013.01); *H01L 29/66825* (2013.01); *H01L 29/66833* (2013.01)

(58) Field of Classification Search
None
See application file for complete search history.

(56) References Cited

U.S. PATENT DOCUMENTS

| 8,319,275 | B2 | 11/2012 | Shim et al. | |
| 8,330,208 | B2 | 12/2012 | Alsmeier et al. | |
| 2010/0034028 | A1* | 2/2010 | Katsumata et al. | 365/185.28 |
| 2010/0155818 | A1 | 6/2010 | Cho et al. | |
| 2011/0049607 | A1* | 3/2011 | Yahashi | 257/324 |
| 2012/0003828 | A1* | 1/2012 | Chang et al. | 438/591 |
| 2012/0058629 | A1* | 3/2012 | You et al. | 438/479 |
| 2014/0014889 | A1* | 1/2014 | Shim et al. | 257/1 |

FOREIGN PATENT DOCUMENTS

| KR | 1020100113364 A | 10/2010 |
| KR | 1020120003678 A | 1/2012 |
| KR | 1020120025133 A | 3/2012 |

* cited by examiner

*Primary Examiner* — Daniel Luke
(74) *Attorney, Agent, or Firm* — Myers Bigel Sibley & Sajovec, PA

(57) ABSTRACT

Methods of forming semiconductor devices are provided. A method of forming a semiconductor device may include forming a structure including insulating layers and gate layers that are alternately and repeatedly stacked on a substrate. The method may include forming through-holes in the structure. The method may include forming first patterns on sidewalls of the gate layers, by performing an oxidation process. The method may include forming second patterns on portions of the substrate, by performing the oxidation process. The method may include removing the second patterns. Moreover, the method may include forming semiconductor patterns in the through-holes.

20 Claims, 19 Drawing Sheets

METHODS OF FORMING SEMICONDUCTOR DEVICES, INCLUDING FORMING PATTERNS BY PERFORMING AN OXIDATION PROCESS

CROSS-REFERENCE TO RELATED APPLICATION

This U.S. non-provisional patent application claims priority under 35 U.S.C. §119 to Korean Patent Application No. 10-2013-0096083, filed on Aug. 13, 2013, in the Korean Intellectual Property Office, the disclosure of which is hereby incorporated herein by reference in its entirety.

BACKGROUND

The present disclosure relates to methods of forming semiconductor devices. Semiconductor devices may become more highly integrated to provide high performance and low costs thereof. The integration density of semiconductor devices may be a factor that influences the costs of the semiconductor devices such that high integration degrees of semiconductor devices may be demanded. An integration degree of a conventional two-dimensional (2D) or planar memory device may be mainly determined by an area where a unit memory cell occupies. Therefore, the integration density of the conventional 2D memory device may be affected by the level of a technique of forming fine patterns. However, the use of high-priced equipment to form fine patterns may impede the rate at which the integration density of 2D memory devices continues to increase.

Three-dimensional (3D) semiconductor devices including three-dimensionally arranged memory cells have been proposed to overcome limitations of 2D memory devices. However, production of 3D semiconductor memory devices may be expensive when compared with 2D semiconductor memory devices and may have concerns regarding providing reliable product characteristics.

SUMMARY

Various embodiments of the present inventive concepts provide a method of manufacturing a semiconductor device. The method may include forming a thin layer structure including insulating layers and gate layers that are alternately and repeatedly stacked on a substrate. The method may include forming through-holes that penetrate the thin layer structure and expose portions of the substrate. The method may include forming first patterns on sidewalls of the gate layers that are exposed by the through-holes, by performing an oxidation process. The method may include forming second patterns on the portions of the substrate that are exposed by the through-holes, by performing the oxidation process. The method may include removing the second patterns. Moreover, the method may include forming lower semiconductor patterns in lower regions of the through-holes after removing the second patterns.

In some embodiments, forming the first patterns may include oxidizing portions of the gate layers, and forming the second patterns may include oxidizing the portions of the substrate that are exposed by the through-holes. Moreover, each of the first patterns may include a first sidewall contacting a respective one of the gate layers and a second sidewall opposite the first sidewall. A first thickness of each of the first patterns may be defined as a distance between the first and second sidewalls. Each of the second patterns may include a first surface contacting the substrate and a second surface opposite the first surface. A second thickness of each of the second patterns may be defined as a distance between the first and second surfaces, and the first thickness may be thicker than the second thickness.

According to some embodiments, removing the second patterns may include performing a dry or wet etching process to remove the second patterns and portions of the first patterns. Residual portions of the first patterns may be on the gate layers after the dry or wet etching process. Moreover, forming the lower semiconductor patterns may include performing a selective epitaxial growth (SEG) process on portions of the substrate that are exposed by removing the second patterns.

In some embodiments, each of the lower semiconductor patterns may cover at least one of the residual portions of the first patterns. Moreover, the method may include removing ones of the residual portions of the first patterns that are not covered by the lower semiconductor patterns and forming a vertical insulator and an upper semiconductor pattern in an upper region of each of the through-holes.

According to some embodiments, forming the thin layer structure may include alternately and repeatedly depositing the insulating layers and the gate layers, and the method may include injecting impurities into each of the gate layers concurrently with depositing the gate layers.

In some embodiments, the impurities may include a Group III element, a Group V element, or a combination of the Group III element and the Group V element. In some embodiments, the impurities may include carbon. Moreover, in some embodiments, the gate layers may include silicon.

According to some embodiments, the method may include forming gate electrodes using the gate layers, by patterning the thin layer structure to form trenches spaced apart from the through-holes, forming a metal layer in the trenches, performing an annealing process to react the gate layers with the metal layer, and removing unreacted portions of the metal layer.

A method of forming a semiconductor device, according to various embodiments, may include forming a structure that includes insulating layers and gate layers that are alternately and repeatedly stacked on a substrate. The method may include forming through-holes in the structure. The method may include performing an oxidation process to form first patterns on respective sidewalls of the gate layers and to form second patterns on respective portions of the substrate. The method may include removing the second patterns. Moreover, the method may include forming semiconductor patterns in the through-holes after removing the second patterns.

In some embodiments, performing the oxidation process may include oxidizing the sidewalls of the gate layers and oxidizing the portions of the substrate, to form the first and second patterns to first and second thicknesses, respectively. The first thickness of the first patterns may be thicker than the second thickness of the second patterns. Moreover, removing the second patterns may include removing the second patterns from the substrate, and reducing the first thickness of first patterns to provide a reduced first thickness of the first patterns on the gate layers.

According to some embodiments, forming the semiconductor patterns may include forming the semiconductor patterns on the substrate, using the reduced first thickness of the first patterns on the gate layers as a mask for the gate layers. Moreover, the method may include forming gate electrodes by reacting a metal with the gate layers after removing the second patterns.

In some embodiments, the gate layers may include at least one impurity. Moreover, oxidizing the sidewalls of the gate layers may include oxidizing the gate layers that include the at least one impurity, to form the first patterns having the first thickness that is thicker than the second thickness of the second patterns.

A method of forming a semiconductor device, according to various embodiments, may include forming a structure that includes insulating layers and gate layers that are alternately and repeatedly stacked on a substrate. The method may include forming through-holes in the structure. The method may include performing an oxidation process that concurrently oxidizes sidewalls of the gate layers and portions of the substrate, to form respective first patterns on the sidewalls of the gate layers to a first thickness that is thicker than a second thickness to which the oxidation process forms respective second patterns on the portions of the substrate. The method may include removing the second patterns from the substrate while reducing the first thickness of first patterns to provide a reduced first thickness of the first patterns on the gate layers. Moreover, the method may include forming semiconductor patterns on the substrate, using the reduced first thickness of the first patterns on the gate layers as a mask for the gate layers.

In some embodiments, the method may include forming gate electrodes by reacting a metal with the gate layers. The gate layers may include at least one impurity, and oxidizing the sidewalls of the gate layers may include oxidizing the gate layers that include the at least one impurity to form the first patterns that have the first thickness that is thicker than the second thickness of the second patterns. Moreover, the method may include forming a trench in the structure, forming the metal in the trench, and forming an insulator on the structure and adjacent one of the semiconductor patterns, before forming the trench in the structure.

A semiconductor device, according to various embodiments, may include a stack structure that includes gate electrodes and insulating layers alternately and repeatedly stacked on a substrate. The semiconductor device may include a through-hole penetrating the stack structure. The semiconductor device may include a lower semiconductor pattern in the through-hole. The semiconductor device may include an upper semiconductor pattern on the lower semiconductor pattern and in the through-hole. Moreover, the semiconductor device may include a vertical insulator between the upper semiconductor pattern and the stack structure. A first distance between first and second exterior sidewalls of the vertical insulator on first and second sides, respectively, of the through-hole may be longer than a second distance between first and second exterior sidewalls of the lower semiconductor pattern.

In some embodiments, the vertical insulator of the semiconductor device may contact one of the insulating layers that is adjacent the lower semiconductor pattern. In some embodiments, respective ones of the gate electrodes may fill spaces between the insulating layers. Moreover, the gate electrodes may include a metal silicide.

BRIEF DESCRIPTION OF THE DRAWINGS

The inventive concepts will become more apparent in view of the attached drawings and accompanying detailed description.

DETAILED DESCRIPTION

Figure 1:
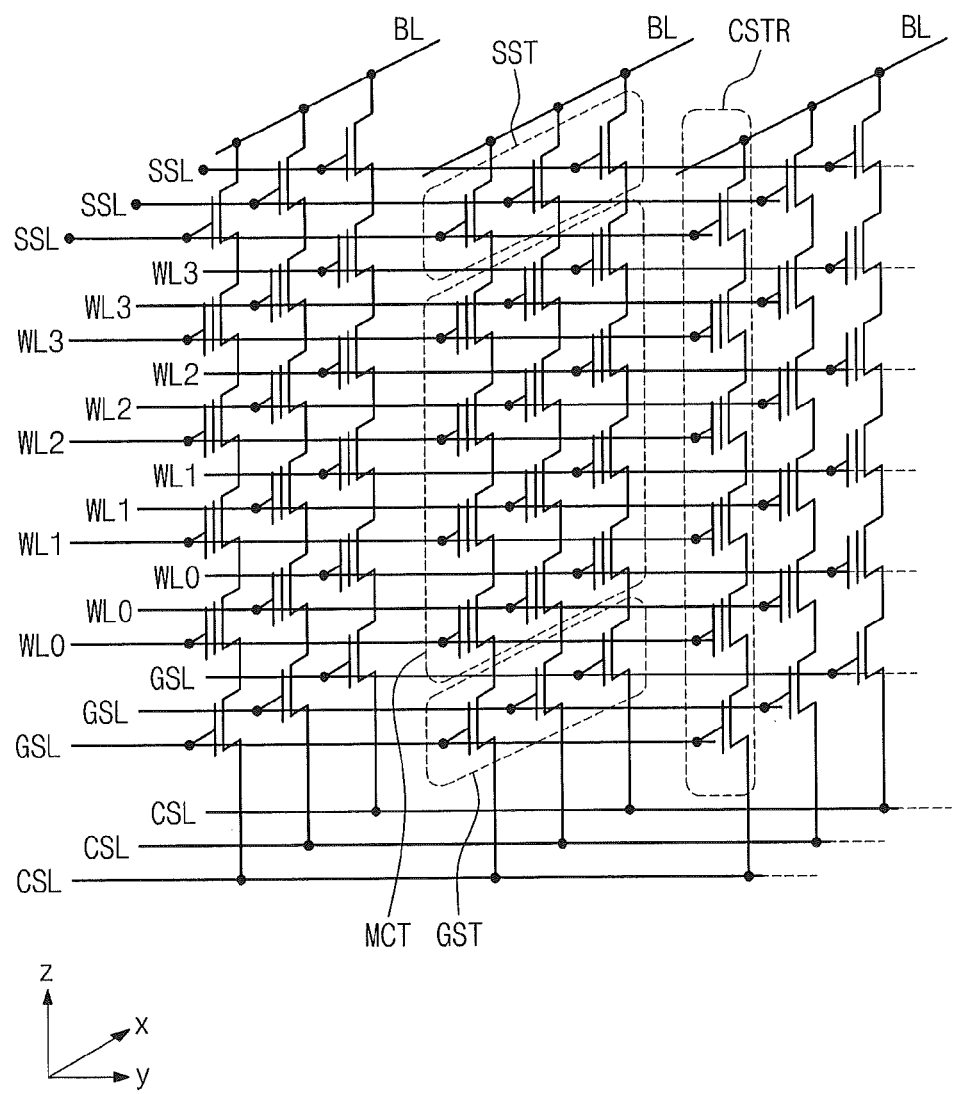
FIG. 1 is a schematic circuit diagram illustrating a cell array of a three-dimensional semiconductor memory device according to example embodiments of the inventive concepts.

Example embodiments are described below with reference to the accompanying drawings. Many different forms, and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a schematic circuit diagram illustrating a cell array of a three-dimensional semiconductor memory device according to example embodiments of the inventive concepts. Referring to FIG. 1, a cell array of a three-dimensional (3D) semiconductor memory device according to example embodiments may include a common source line CSL, a plurality of bit lines BL and a plurality of cell strings CSTR disposed between the common source line CSL and the bit lines BL.

The common source line CSL may be a conductive layer disposed on a substrate, or a dopant region formed in the substrate. The bit lines BL may be conductive patterns (e.g., metal lines) spaced apart upwardly from the substrate. The bit lines BL may be two-dimensionally arranged and a plurality of cell strings CSTR may be connected in parallel to each of the bit lines BL. The cell strings CSTR may be connected in common to the common source line CSL. In other words, a plurality of cell strings CSTR may be disposed between the common source lines CSL and a plurality of the bit lines BL. In some embodiments, the common source lines CSL may be provided in plural and the plurality of common source lines CSL may be two-dimensionally arranged. The same voltage may be applied to the common source lines CSL. Alternatively, the common source lines CSL may be controlled independently of each other in an operation mode.

Each of the cell strings CSTR may consist of a ground selection transistor GST connected to the common source line CSL, a string selection transistor SST connected to the bit line BL, and a plurality of memory cell transistors MCT disposed between the ground and string selection transistors GST and SST. The ground selection transistor GST, the memory cell transistors MCT and the string selection transistor SST may be connected in series to each other.

The common source line CSL may be connected in common to sources of the ground selection transistors GST. A ground selection line GSL, a plurality of word lines WL0 to WL3 and a string selection line SSL may be used as gate electrodes of the ground selection transistor GST, the memory cell transistors MCT and the string selection transistor SST. Each of the memory cell transistors MCT may include a data storage element.

Figure 2:
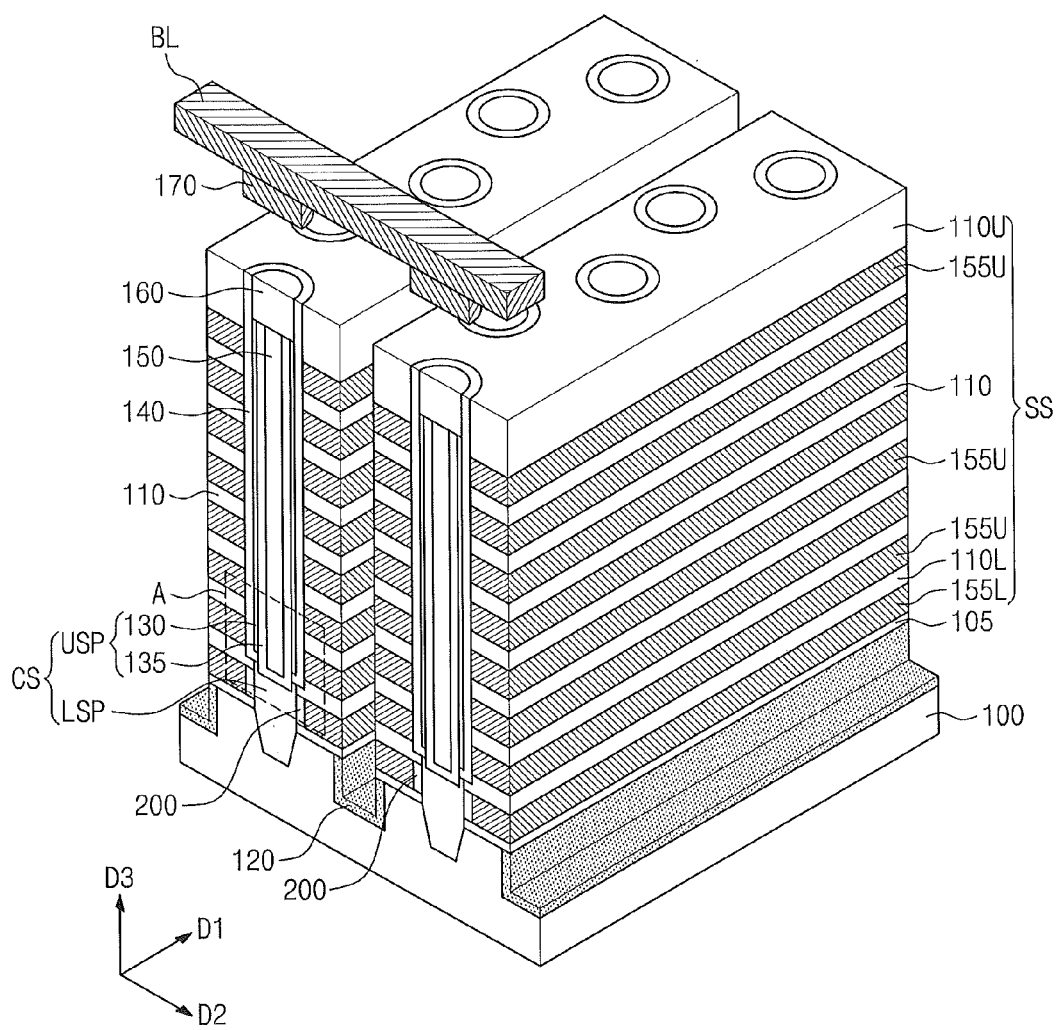
FIG. 2 is a perspective view illustrating a three-dimensional semiconductor memory device according to example embodiments of the inventive concepts.
Figure 3:
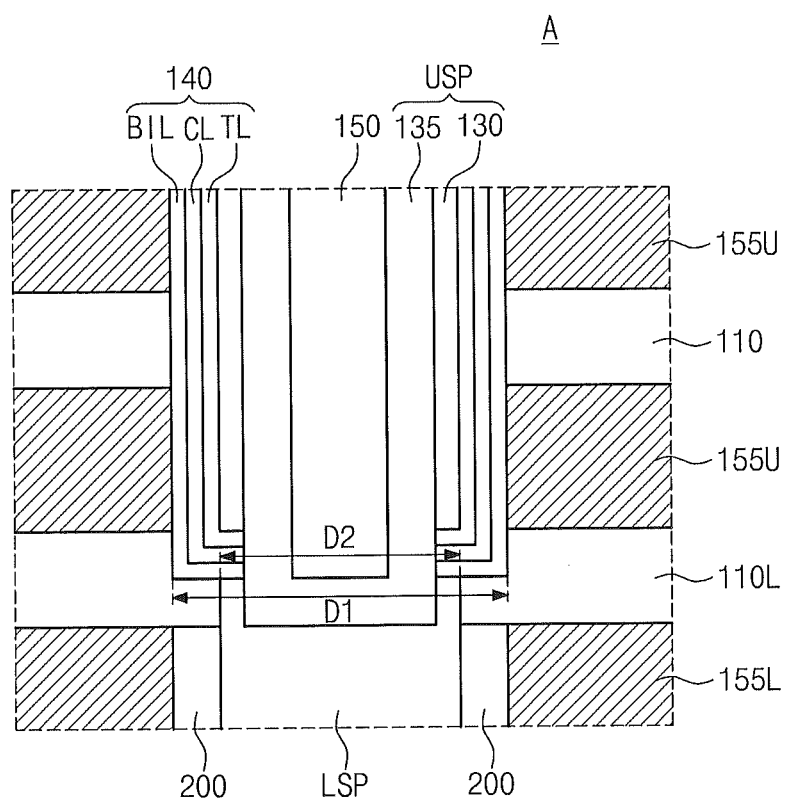
FIG. 3 is an enlarged cross-sectional view of a portion 'A' of FIG. 2.

FIG. 2 is a perspective view illustrating a three-dimensional semiconductor memory device according to example embodiments of the inventive concepts. FIG. 3 is an enlarged cross-sectional view of a portion 'A' of FIG. 2. Referring to FIG. 2, a stack structure SS may be disposed on a substrate 100. The stack structure SS may include insulating layers 110L, 110 and 110U and gate electrodes that are alternately and repeatedly stacked on the substrate 100. A plurality of the stack structure SS may be disposed on the substrate 100. The stack structures SS may be laterally spaced apart from each other. The gate electrodes of each stack structure SS may include at least one lower gate electrode 155L on the substrate 100 and upper gate electrodes 155U sequentially stacked on the lower gate electrode 155L. In the stack structure SS, a lowermost one of the insulating layers 110L, 110 and 110U is defined as a lowermost insulating layer 110L, and an uppermost one of the insulating layers 110L, 110 and 110U is defined as an uppermost insulating layer 110U.

For example, the substrate 100 may be a silicon substrate, a germanium substrate, or a silicon-germanium substrate. The substrate 100 may include common source regions 120 doped with dopants. The common source regions 120 may have linear shapes extending in a first direction D1. The common source regions 120 may be arranged in a second direction D2 intersecting the first direction D1.

The stack structure SS may have a linear shape extending in the first direction D1 when viewed from a plan view. The common source lines 120 may be disposed at both sides of the stack structure SS. A lower insulating layer 105 may be disposed between the substrate 100 and the stack structure SS. For example, the lower insulating layer 105 may include a silicon nitride layer, a high-k dielectric layer (e.g., an aluminum oxide layer and/or a hafnium oxide layer), or any combination thereof. Additionally, the lower insulating layer 105 may further include a silicon oxide layer. The lower insulating layer 105 may be thinner than the insulating layers 110L, 110 and 110U.

A plurality of channel structures CS may penetrate the stack structure SS and may be electrically connected to the substrate 100. The channel structures CS may be arranged in the first direction D1 when viewed from a plan view. As illustrated in FIG. 2, the channel structures CS may be arranged in a zigzag form along the first direction D1 when viewed from a plan view.

Each of the channel structures CS may include a lower semiconductor pattern LSP and an upper semiconductor pattern USP sequentially stacked on the substrate 100. The lower semiconductor pattern LSP may penetrate a lower portion of the stack structure SS and may be electrically connected to the substrate 100. The upper semiconductor pattern USP may penetrate an upper portion of the stack structure SS and may be electrically connected to the lower semiconductor pattern LSP.

The upper semiconductor pattern USP may have a hollow pipe-shape or macaroni-shape. A bottom end of the upper semiconductor pattern USP may be in a closed state. An inner region of the upper semiconductor pattern USP may be filled with a filling insulation pattern 150. A bottom surface of the upper semiconductor pattern USP may be disposed at a level lower than a top surface of the lower semiconductor pattern LSP. In other words, a portion of the top surface of the lower semiconductor pattern LSP may be recessed, and a bottom end portion of the upper semiconductor pattern USP may be inserted in the recessed region/portion of the top surface of the lower semiconductor pattern LSP.

The upper semiconductor pattern USP may include a semiconductor material. In some embodiments, the upper semiconductor pattern USP may include silicon (Si), germanium (Ge), or a combination thereof. The upper semiconductor pattern USP may be doped with dopants or may be undoped. The upper semiconductor pattern USP may have at least one of a single-crystalline structure, an amorphous structure, or a poly-crystalline structure.

In more detail, the upper semiconductor pattern USP may include a first semiconductor pattern 130 and a second semiconductor pattern 135. The first semiconductor pattern 130 may cover an inner sidewall of the stack structure SS. The first semiconductor pattern 130 may have a pipe-shape or macaroni-shape of which a top end and a bottom end are opened. The first semiconductor pattern 130 may not be in contact with the lower semiconductor pattern LSP and may be spaced apart from the lower semiconductor pattern LSP. The second semiconductor pattern 135 may have a pipe-shape or macaroni-shape of which a lower end is closed. An inner region of the second semiconductor pattern 135 may be filled with the filling insulation pattern 150. The second semiconductor pattern 135 may be in contact with an inner sidewall of the first semiconductor pattern 130 and an upper portion of the lower semiconductor pattern LSP. A bottom surface of the second semiconductor pattern 135 may be disposed at a lower height than the top surface of the lower semiconductor pattern LSP. The second semiconductor pattern 135 may electrically connect the first semiconductor pattern 130 to the lower semiconductor pattern LSP. In some embodiments, the first and second semiconductor patterns 130 and 135 may be undoped or doped with dopants of the same conductivity type as the substrate 100. In some embodiments, the first semiconductor pattern 130 and the second semiconductor pattern 135 may have a poly-crystalline structure or a single-crystalline structure.

The lower semiconductor pattern LSP may be formed of a semiconductor material having the same conductivity type as the substrate 100. In some embodiments, the lower semiconductor pattern LSP may be an epitaxial pattern formed using the substrate 100 of a semiconductor material as a seed. In this case, the semiconductor pattern LSP may have a single-crystalline structure or a poly-crystalline structure. In some embodiments, a bottom surface of the lower semiconductor pattern LSP may be disposed at a lower level than a top surface of the substrate 100. In other words, a portion of the substrate 100 under the lower semiconductor pattern LSP may be recessed and a lower portion of the lower semiconductor pattern LSP may be inserted in the recessed region of the substrate 100.

The stack structure SS will be described in more detail hereinafter. The stack structure SS may include at least one lower gate electrode 155L adjacent the lower semiconductor pattern LSP and the upper gate electrodes 155U adjacent the upper semiconductor pattern USP. The lower gate electrode 155L and the upper gate electrodes 155U may be stacked along a third direction D3 perpendicular to the first and second directions D1 and D2. The gate electrodes 155L and 155U may be separated from each other by the insulating layers 110L, 110 and 110U disposed between the gate electrodes 155L and 155U.

In some embodiments, the lower gate electrode 155L may be used as the gate electrode of the ground selection transistor GST described with reference to FIG. 1. In other words, the lower gate electrode 155L may be used as the gate electrode of the ground selection transistor GST controlling electrical connection between the common source region 120 formed in the substrate 100 and the lower semiconductor pattern LSP in a 3D NAND flash memory device. Some of the upper gate electrodes 155U may be used as the gate electrodes of the memory cell transistors MCT described with reference to FIG. 1. In the stack structure SS, an uppermost one of the upper gate electrodes 155U may be used as the gate electrode of the string selection transistor SST described with reference to FIG. 1. In other words, the uppermost one of the upper gate electrodes 155U of the stack structure SS may be used as the gate electrode of the string selection transistor SST controlling electrical connection between a bit line BL and the channel structure CS in the 3D NAND flash memory device.

At least one of the insulating layers 110L, 110 and 110U, which is adjacent the lower semiconductor pattern LSP, may be in direct contact with a sidewall of the lower semiconductor pattern LSP. A first pattern 200 may be disposed between the lower semiconductor pattern LSP and the lower gate electrode 155L adjacent the lower semiconductor pattern LSP. The first pattern 200 may be formed of silicon oxide including impurities. The impurities may include at least one selected from a group consisting of Group III elements and Group V elements. Additionally, the impurities may further include carbon (C). For example, the impurities may include boron (B), arsenic (As), phosphorus (P), carbon (C), or any combination thereof. The first pattern 200 may be formed by oxidizing a silicon layer injected with the impurities.

A vertical insulator 140 may be disposed between the stack structure SS and the upper semiconductor pattern USP. The vertical insulator 140 may have a pipe-shape or macaroni-shape of which a top end and a bottom end are open. According to some embodiments, the vertical insulator 140 may be in contact with the top surface of the lower semiconductor pattern LSP. Additionally, a bottom surface of the vertical insulator 140 may be in contact with the at least one of the insulating layers 110L, 110 and 110U that is adjacent the lower semiconductor pattern LSP.

FIG. 3 is an enlarged view of the portion 'A' of FIG. 2. Referring to FIG. 3, the vertical insulator 140 may include a memory element of a flash memory device. In other words, the vertical insulator 140 may include a charge storage layer CL of the flash memory device. Data storing in the vertical insulator 140 may be changed using Fowler-Nordheim tunneling caused by a voltage difference between the upper semiconductor pattern USP and one of the upper gate electrodes 155U. Alternatively, the vertical insulator 140 may include a thin layer capable of storing information using another operation principle, for example, a thin layer for a phase change memory cell or a thin layer for a variable resistance memory cell.

In some embodiments, the vertical insulator 140 may include the charge storage layer CL and a tunnel insulating layer TL that are sequentially stacked. The tunnel insulating layer TL may be in direct contact with the upper semiconductor pattern USP, and the charge storage layer CL may be disposed between the tunnel insulating layer TL and the upper gate electrodes 155U. In some embodiments, the vertical insulator 140 may further include a blocking insulating layer BIL disposed between the charge storage layer CL and the upper gate electrodes 155U, as illustrated in FIG. 3.

The charge storage layer CL may include at least one of a silicon nitride layer, a silicon oxynitride layer, a silicon-rich nitride layer, a nano-crystalline silicon layer, or a laminated tray layer. The tunnel insulating layer TL may include a material having a greater energy band gap than the charge storage layer CL. For example, the tunnel insulating layer TL may include a silicon oxide layer. The blocking insulating layer BIL may include a material having a greater energy band gap than the charge storage layer CL. In some embodiments, the blocking insulating layer BIL may include a silicon oxide layer, a silicon nitride layer, and/or a silicon oxynitride layer.

The vertical insulator 140 may further include a capping layer between the upper semiconductor pattern USP and the insulating layers 110L, 110 and 110U. The capping layer may be in direct contact with the insulating layers 110L, 110 and 110U and may be vertically divided into a plurality of portions by the upper gate electrodes 155U. In some embodiments, the capping layer may vertically extend between the upper semiconductor pattern USP and the upper gate electrodes 155U. The capping layer may have an etch selectivity with respect to the charge storage layer CL and may include an insulating material different from the insulating layers 110L, 110 and 110U. For example, the capping layer may include at least one of a silicon layer, a silicon oxide layer, a poly-silicon layer, a silicon carbide layer. At this time, the material of the capping layer may be different from the insulating layers 110L, 110 and 110U. In some embodiments, the capping layer may include a high-k dielectric layer such as a tantalum oxide ($Ta_2O_5$) layer, a titanium oxide ($TiO_2$) layer, a hafnium oxide ($HfO_2$) layer, and/or a zirconium oxide ($ZrO_2$) layer.

An external diameter D1 of the bottom surface of the vertical insulator 140 may be greater than a diameter D2 of the top surface of the lower semiconductor pattern LSP. Thus, the bottom surface of the vertical insulator 140 may be in contact with the at least one of the insulating layers 110L, 110 and 110U that is adjacent the lower semiconductor pattern LSP.

Referring again to FIG. 2, a conductive pad 160 may penetrate the stack structure SS to be connected to each of the upper semiconductor patterns USP. A top surface of the conductive pad 160 may be substantially coplanar with the top surface of the stack structure SS. A bottom surface of the conductive pad 160 may be in direct contact with the upper semiconductor pattern USP. The vertical insulator 140 may also be disposed between the conductive pad 160 and the insulating layer 110U adjacent the conductive pad 160. The conductive pad 160 may be a dopant region doped with dopants or may include a conductive material.

Bit lines BL may be disposed on the stack structure SS. The bit lines BL may cross over the stack structure SS. The bit lines BL may be electrically connected to the conductive pads 160 through contact plugs 170.

Figure 4:
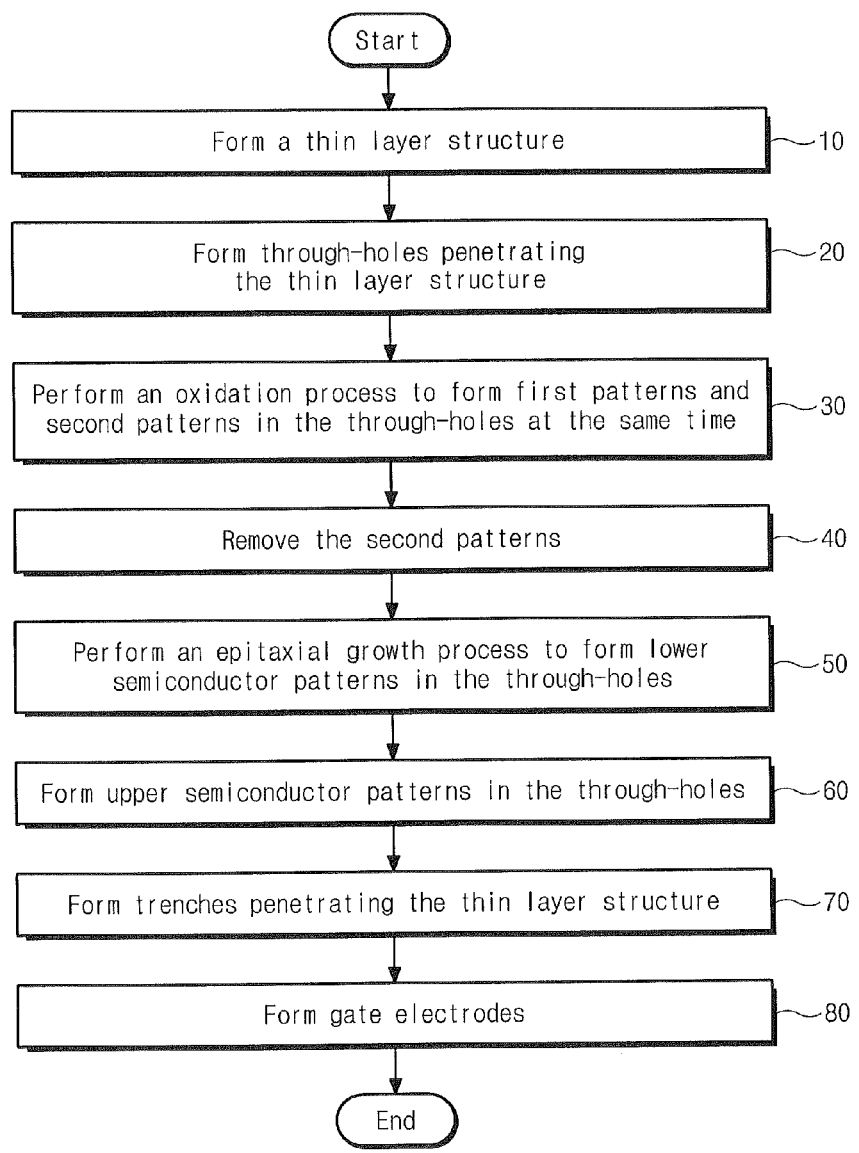
FIG. 4 is a flowchart illustrating a method of manufacturing a three-dimensional semiconductor memory device according to example embodiments of the inventive concepts.

FIG. 4 is a flowchart illustrating a method of manufacturing a three-dimensional semiconductor memory device according to example embodiments of the inventive concepts. FIGS. 5A and 6 to 15 are cross-sectional views illustrating a method of manufacturing a three-dimensional semiconductor memory device according to example embodiments of the inventive concepts.

Figure 5A:
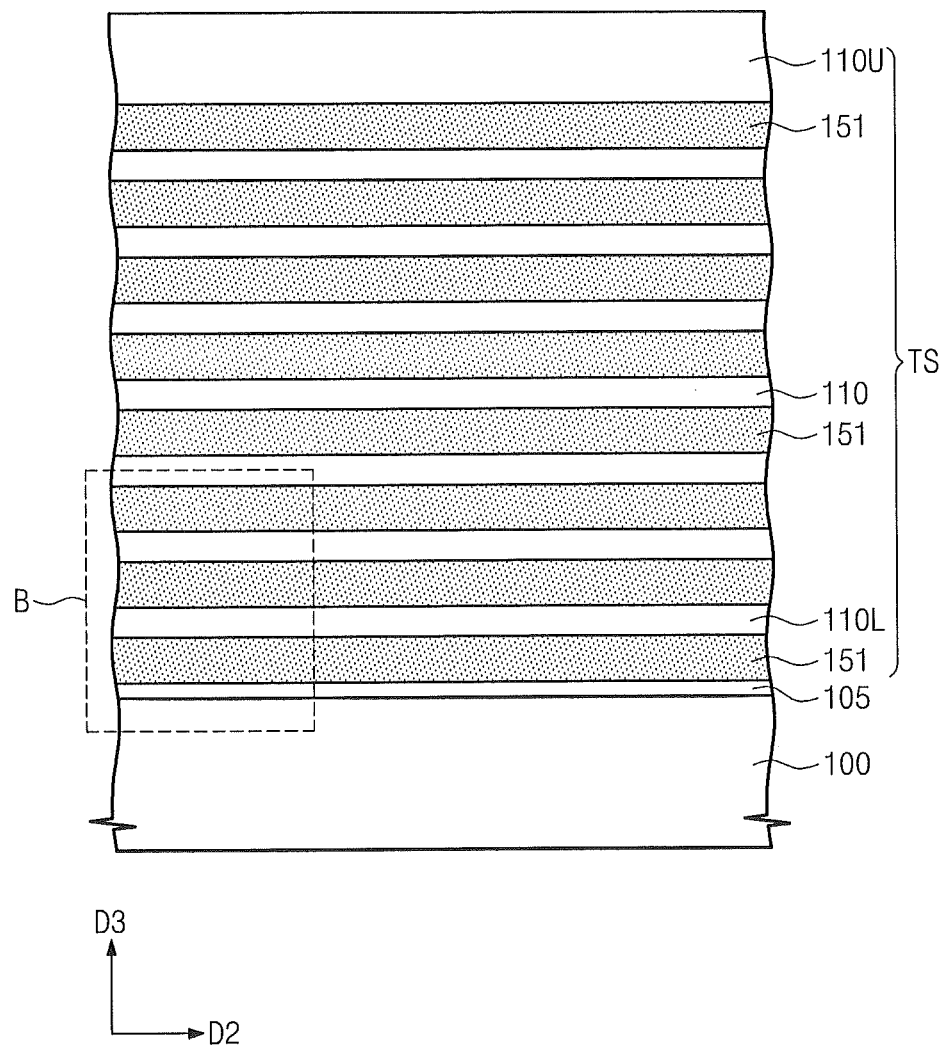
FIGS. 5A and 6 to 15 are cross-sectional views illustrating a method of manufacturing a three-dimensional semiconductor memory device according to example embodiments of the inventive concepts.

Referring to FIGS. 4 and 5A, gate layers 151 and insulating layers 110L, 110 and 110U may be alternately and repeatedly deposited on the substrate 100 to form a thin layer structure TS (Block 10). In the thin layer structure TS, a lowermost one of the insulating layers 110L, 110 and 110U is defined as a lowermost insulating layer 110L, and an uppermost one of the insulating layers 110L, 110 and 110U is defined as an uppermost insulating layer 110U. The substrate 100 may be a silicon substrate, a germanium substrate, or a silicon-germanium substrate.

According to some embodiments, the gate layers 151 may have the same thickness. According to some embodiments, a lowermost one and an uppermost one of the gate layers 151 may be thicker than the gate layers 151 disposed between the lowermost gate layer and the uppermost gate layer. The insulating layers 110L, 110 and 110U may have the same thickness. Alternatively, the lowermost insulating layer 110L, the uppermost insulating layer 110U, and the insulating layers 110 therebetween may have different thicknesses from each other.

The gate insulating layers 151 and the insulating layers 110L, 110 and 110U may be formed by, for example, a thermal chemical vapor deposition (CVD) process, a plasma-enhanced CVD process, and/or an atomic layer deposition (ALD) process.

The gate layers 151 may be formed of, for example, silicon layers. The gate layers 151 may have a poly-crystalline structure or a single crystalline structure. The insulating layers 110L, 110 and 110U may be formed of, for example, silicon oxide layers.

A lower insulating layer 105 may be formed between the substrate 100 and the thin layer structure TS. The lower insulating layer 105 may be formed of a material having a high etch selectivity with respect to the gate layers 151 and the insulating layers 110L, 110 and 110U. For example, the lower insulating layer 105 may be formed of a silicon nitride layer, a high-k dielectric layer (e.g., an aluminum oxide layer and/or a hafnium oxide layer), or any combination thereof. Additionally, the lower insulating layer 105 may further include a silicon oxide layer. The lower insulating layer 105 may be thinner than the gate layers 151 and the insulating layers 110L, 110 and 110U.

Figure 6:
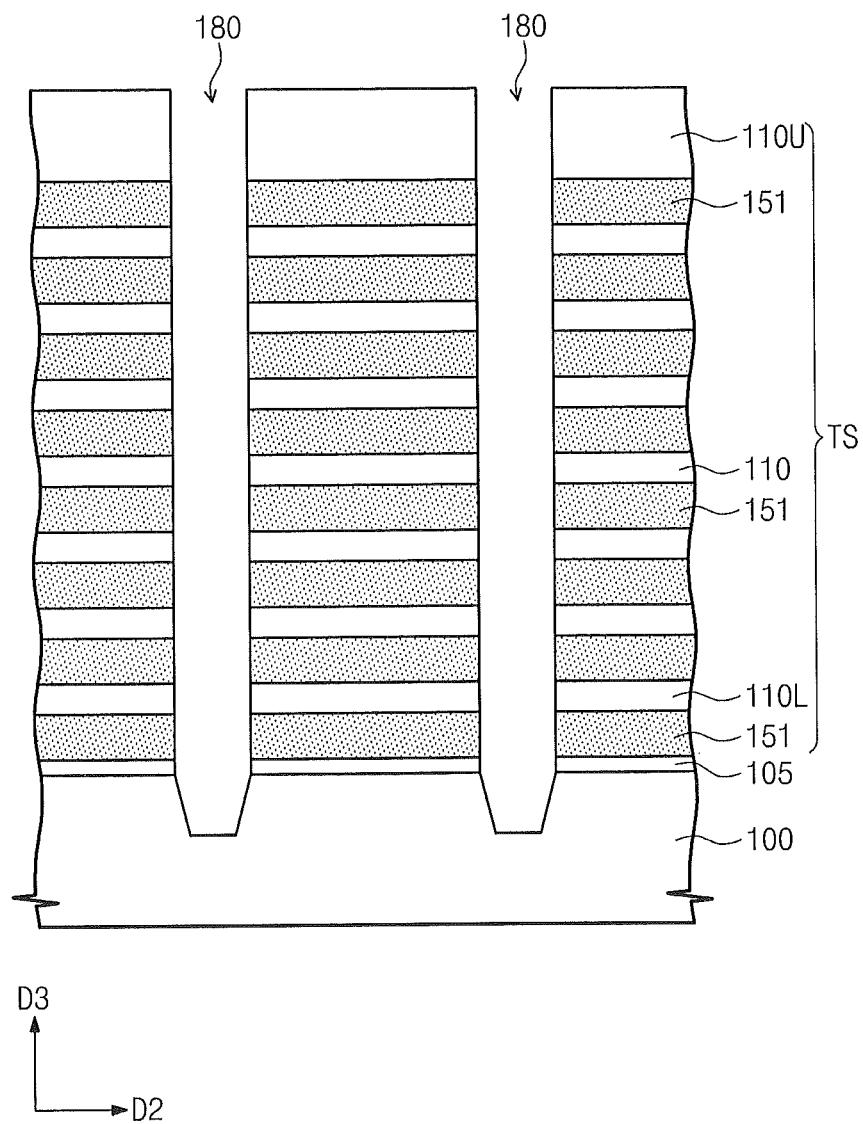

Referring to FIGS. 4 and 6, through-holes 180 may be formed to penetrate the thin layer structure TS (Block 20). The through-holes 180 may expose the substrate 100. Like the channel structures CS illustrated in FIG. 2, the through-holes 180 may be two-dimensionally formed on the substrate 100. In some embodiments, the through-holes 180 may be arranged in a zigzag form in the first direction D1 when viewed from a plan view.

A mask layer having openings may be formed on the thin layer structure TS. The openings of the mask layer may define the through-holes 180. The thin layer structure TS may be etched using the mask layer having the openings as an etch mask to form the through-holes 180. The mask layer may be formed of a material having an etch selectivity with respect to the gate layers 151 and the insulating layers 110L, 110 and 110U. During the etching process, a top surface of the substrate 100 under the through-holes 180 may be etched by over-etching. Thus, the top surface of the substrate 100 under the through-holes 180 may be recessed. Additionally, widths of lower portions of the through-holes 180 may be narrower than widths of the upper portions of the through-holes 180 by the etching process. Thereafter, the mask layer may be removed.

Figure 7:
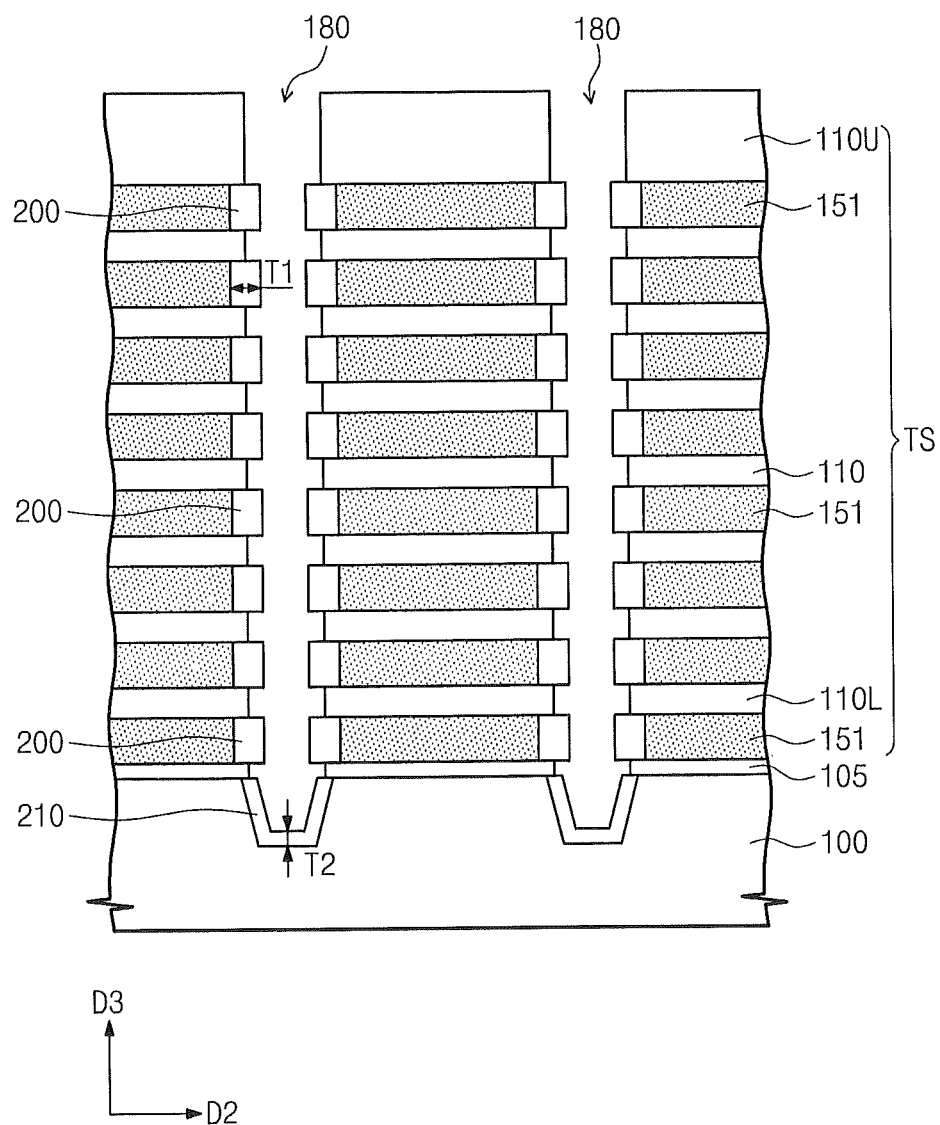

Referring to FIGS. 4 and 7, an oxidation process may be performed on the resultant structure having the through-holes 180 to form first patterns 200 and second patterns 210 in the through-holes 180 (Block 30). The first patterns 200 may be formed on sidewalls of the gate layers 151, which are exposed by the through-holes 180. Portions of the gate layers 151 may be oxidized by the oxidation process, thereby forming the first patterns 200. The second patterns 210 may be formed on the substrate 100 exposed by the through-holes 180. Portions of the substrate 100 may be oxidized by the oxidation process, thereby forming the second patterns 210. The oxidation process may be, for example, a thermal oxidation process. The first patterns 200 and the second patterns 210 may be concurrently formed by the oxidation process (e.g., may be formed at the same time and/or by the same oxidation process).

During the oxidation process, an oxidizing amount of each of the gate layers 151 may be greater than an oxidizing amount of the substrate 100. In other words, an oxidation rate of the gate layers 151 may be greater than an oxidation rate of the substrate 100.

Figure 5B:
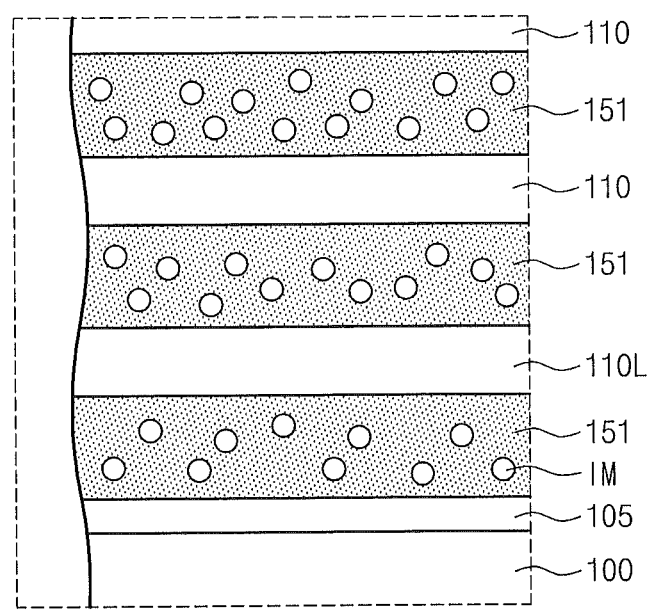
FIG. 5B is an enlarged view of a portion 'B' of FIG. 5A.

FIG. 5B is an enlarged view of a portion 'B' of FIG. 5A. Impurities IM may be injected into the gate layers 151 such that the oxidation rate of the gate layers 151 is greater than the oxidation rate of the substrate 100. The impurities IM may include at least one of Group III elements and Group V elements. Additionally, the impurities IM may further include carbon (C). For example, the impurities may include boron (B), arsenic (As), phosphorus (P), carbon (C), or any combination thereof.

According to some embodiments, the process of injecting the impurities IM in the gate layers 151 may be performed simultaneously with the deposition process of the gate layers 151, which is described with reference to FIG. 5A. For example, if each gate layer 151 is formed by the CVD process, a gas containing the impurities may be supplied along with a deposition source gas, thereby depositing each gate layer 151 and injecting the impurities IM in each gate layer 151 concurrently (e.g., at the same time or otherwise overlapping in time). In this case, a concentration of the impurities IM may be substantially uniform in each gate layer 151. According to some embodiments, the impurities IM may be injected into the gate layers 151 by a diffusion process after the formation of the through-holes 180 described with reference to FIG. 6 and before the oxidation process described with reference to FIG. 7. For example, a gas containing the impurities IM may be supplied to the resultant structure having the through-holes 180 and heat applied to the resultant structure. Thus, the impurities IM may be injected into the gate layers 151 by diffusion caused by a concentration difference of the impurities IM. The impurities IM may be locally injected in sidewall portions of the gate layers 151, which are exposed by the through-holes 180. In this case, the impurities IM may also be injected into the substrate 100 exposed by the through-holes 180. However, if the gate layers 151 are formed by poly-silicon layers, the oxidizing amount of the gate layers 151 may be greater than the oxidizing amount of the substrate 100 in the oxidation process described with reference to FIG. 7.

Each of the first patterns 200 has a first sidewall contacting each of the gate layers 151 and a second sidewall opposite the first sidewall. A first thickness T1 of each of the first patterns 200 is defined as a distance between the first sidewall and the second sidewall of each of the first patterns 200. Each of the second patterns 210 has a first surface contacting the substrate 100 and a second surface opposite the first surface. A second thickness T2 of each of the second patterns 210 is defined as a distance between the first surface and the second surface of each of the second patterns 210. Because the impurities IM are injected into the gate layers 151, the oxidizing amount of the gate layers 151 may be greater than the oxidizing amount of the substrate 100 in the oxidation process. Thus, the first thickness T1 may be greater than the second thickness T2.

Figure 8:
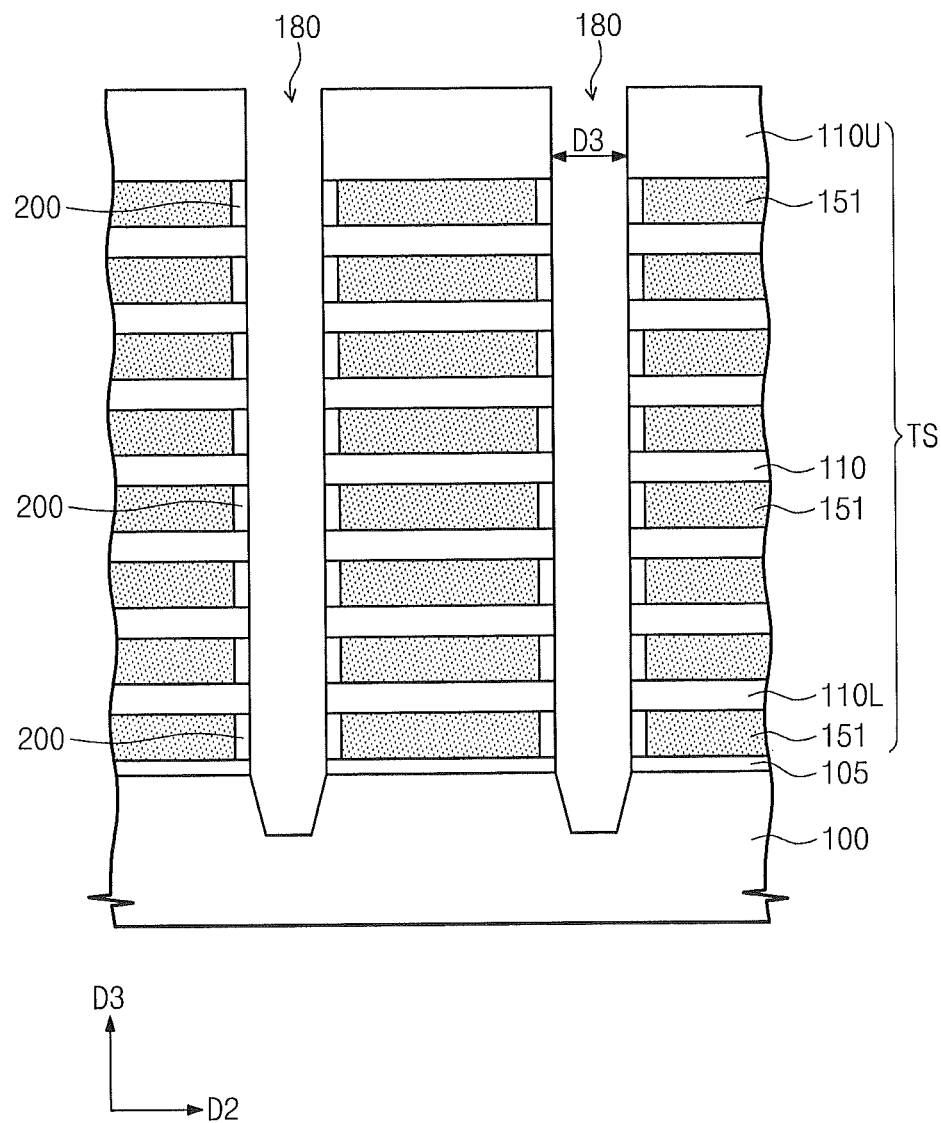

Referring to FIGS. 4 and 8, a dry etching process or a wet etching process may be performed on the resultant structure of FIG. 7 to remove the second patterns 210 (Block 40). Portions of the first patterns 200 may also be removed during the etching process. After the etching process, residual portions of the first patterns 200 may remain on sidewalls of the gate layers 151. The through-holes 180 may have a diameter D3 after the removal of the second patterns 210.

Figure 9:
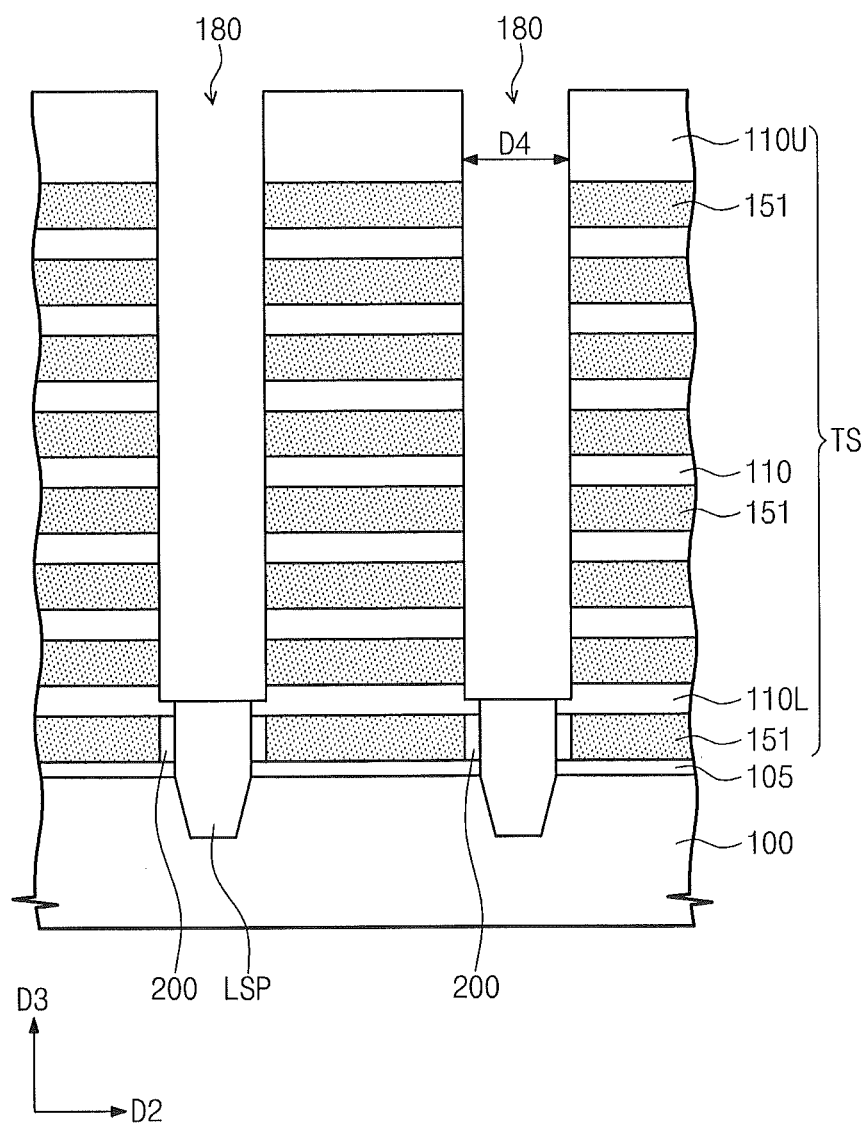

Referring to FIGS. 4 and 9, lower semiconductor patterns LSP may be formed to fill lower regions of the through-holes 180 (Block 50). The lower semiconductor patterns LSP may be formed by performing a selective epitaxial growth (SEG) process using the substrate 100 exposed by the through-holes 180 as a seed. In some embodiments, the lower semiconductor patterns LSP may have pillar-shapes filling the lower regions of the through-holes 180, respectively. In some embodiments, the lower semiconductor patterns LSP may cover sidewalls of at least one gate layer 151. Top surfaces of the lower semiconductor patterns LSP may be disposed at a level between the gate layers 151 vertically adjacent each other. In some embodiments, the top surfaces of the lower semiconductor patterns LSP may be substantially coplanar with the top surface of the substrate 100. In other words, the lower semiconductor patterns LSP may optionally fill only the recessed regions of the substrate 100.

The lower semiconductor patterns LSP may have a single-crystalline structure or a poly-crystalline structure. The lower semiconductor patterns LSP may include, for example, silicon. However, the inventive concepts are not limited thereto. In some embodiments, the lower semiconductor patterns LSP may include at least one of carbon nanostructures, organic semiconductor materials, and compound semiconductor materials.

The lower semiconductor patterns LSP may have the same conductivity type as the substrate 100. The lower semiconductor patterns LSP may be doped with dopant(s) in-situ during the SEG process. Alternatively, dopant ions may be implanted into the lower semiconductor patterns LSP after the formation of the lower semiconductor patterns LSP.

After the lower semiconductor patterns LSP are formed, the first patterns 200, which are disposed in upper regions of the through-holes 180 on the lower semiconductor patterns LSP, may be removed. The first patterns 200 may be removed by a dry etching process or a wet etching process. Portions of the insulating layers 110L, 110 and 110U in the upper regions of the through-holes 180 may also be removed during the etching process of the first patterns 200. Thus, the upper regions of the through-holes 180 may have a diameter D4 greater than the diameter D3. The diameter D4 may correspond to the external diameter D1 of the bottom surface of the vertical insulator 140 of FIG. 3 at a boundary of the upper region and the lower region filled with the lower semiconductor pattern LSP of each of the through-holes 180.

In some embodiments, the first patterns 200 between the lower semiconductor patterns LSP and the at least one gate layer 151 may not be removed but rather may remain. In this case, the first patterns 200 may be used as gate insulating layers between the lower semiconductor patterns LSP and gate electrodes formed using the at least one gate layer 151. However, the inventive concepts are not limited thereto. In some embodiments, if the lower semiconductor patterns LSP fill only the recessed regions of the substrate 100, all of the first patterns 200 may be removed.

According to some embodiments of the inventive concepts, the first and second patterns 200 and 210 having different thicknesses may be formed by the oxidation process at the same time and then the residual portions of the first patterns 200 may remain on the sidewalls of the gate layers 151 by/after the removal of the second patterns 210 and the portions of the first patterns 200. Thereafter, the SEG process may be performed on the substrate 100 exposed by the through-holes 180. At this time, the gate layers 151 may be covered with the residual portions of the first patterns 200. In other words, the residual portions of the first patterns 200 may function as masks of the gate layers 151 during the SEG process. Thus, the lower semiconductor patterns LSP may be formed using the SEG process and a metal element may be injected into the gate layers 151 to form gate electrodes. As a result, the manufacturing process of the 3D semiconductor memory device may be simplified.

Figure 10:
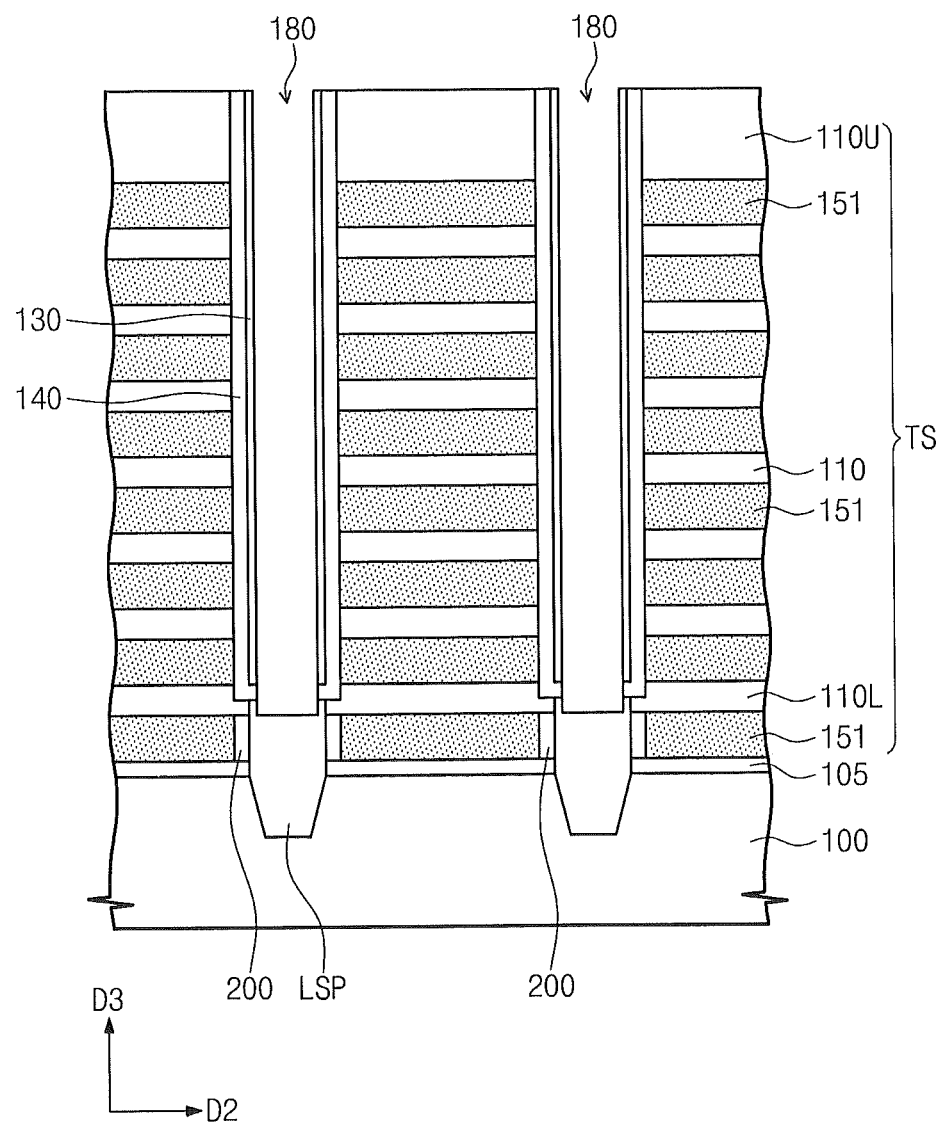

Referring to FIG. 10, a vertical insulator 140 and a first semiconductor pattern 130 may be formed to cover an inner sidewall of each of the through-holes 180 having the lower semiconductor patterns LSP.

In more detail, a vertical insulating layer and a first semiconductor layer may be sequentially formed to cover inner the inner sidewalls of the through-holes 180 having the lower semiconductor patterns LSP. The vertical insulating layer and the first semiconductor layer may partially fill the through-holes 180. A sum of thicknesses of the vertical insulating layer and the first semiconductor layer may be less than a half of a width of each through-hole 180. In other words, the through-holes 180 may not be completely filled with the vertical insulating layer and the first semiconductor layer. Additionally, the vertical insulating layer may cover the top surfaces of the lower semiconductor patterns LSP exposed by the through-holes 180. The vertical insulating layer may be formed of a plurality of thin layers. The vertical insulating layer may be deposited by, for example, a plasma-enhanced CVD process, a physical CVD process, and/or an ALD process.

The vertical insulating layer may include a charge storage layer used as a memory element of a flash memory device. In some embodiments, the charge storage layer may include a trap insulating layer, or an insulating layer including conductive nano dots. Alternatively, the vertical insulating layer may include a thin layer for a phase change memory cell or a thin layer for a variable resistance memory cell.

In some embodiments, the vertical insulating layer may include a blocking insulating layer BIL, the charge storage layer CL and a tunnel insulating layer TL that are sequentially stacked, as illustrated in FIG. 3. The blocking insulating layer BIL may cover sidewalls of the gate layers 151 and the insulating layers 110L, 110 and 110U and the top surfaces of the lower semiconductor patterns LSP in the through-holes 180. The blocking insulating layer BIL may be formed of, for example, a silicon oxide layer. The charge storage layer CL may include a trap insulating layer, or an insulating layer including conductive nano dots. In some embodiments, the charge storage layer CL may include at least one of a silicon nitride layer, a silicon oxynitride layer, a silicon-rich nitride layer, a nano-crystalline silicon layer, or a laminated trap layer. The tunnel insulating layer TL may include at least one material among materials having energy band gaps greater than that of the tunnel insulating layer TL. In some embodiments, the tunnel insulating layer TL may include a silicon oxide layer.

The first semiconductor layer may be formed on the vertical insulating layer. In some embodiments, the first semiconductor layer may include a semiconductor material (e.g., poly-crystalline silicon, single-crystalline silicon or amorphous silicon) formed using one of an ALD process or a CVD process.

After the vertical insulating layer and the first semiconductor layer are sequentially formed, the first semiconductor layer and the vertical insulating layer on the top surfaces of the lower semiconductor patterns LSP may be anisotropically etched to expose the lower semiconductor patterns LSP. Thus, the first semiconductor pattern 130 and the vertical insulator 140 may be formed on the inner sidewall of each of the through-holes 180. In other words, the first vertical insulator 140 and the first semiconductor pattern 130 may have cylindrical shapes of which both ends are opened. Portions of the top surfaces of the lower semiconductor patterns LSP exposed by the first semiconductor patterns 130 may be recessed by over-etching during the anisotropic etch process of the first semiconductor layer and the vertical insulating layer.

On the other hand, a portion of the vertical insulating layer that is disposed under the first semiconductor pattern 130 may not be etched during the anisotropic etching process. In this case, the vertical insulator 140 may have a bottom portion disposed between a bottom surface of the first semiconductor pattern 130 and the top surface of the lower semiconductor pattern LSP.

Outer sidewalls of the vertical insulators 140 may be in contact with inner sidewalls of the upper regions of the through-holes 180. Thus, the external diameter D1 of the each vertical insulator 140 may be greater than the diameter D2 of the top surface of each lower semiconductor pattern LSP, as illustrated in FIG. 3. The bottom surface of the vertical insulator 140 may be in contact with at least one of the insulating layers 110L, 110 and 110U adjacent the lower semiconductor pattern LSP.

Additionally, a top surface of the thin layer structure TS may also be exposed by the anisotropic etching process performed on the first semiconductor layer and the vertical insulating layer. Thus, the vertical insulators 140 and the first semiconductor patterns 130 may be locally formed in the through-holes 180. In other words, the vertical insulators 140 and the first semiconductor patterns 130 may be two-dimensionally arranged when viewed from a plan view.

Figure 11:
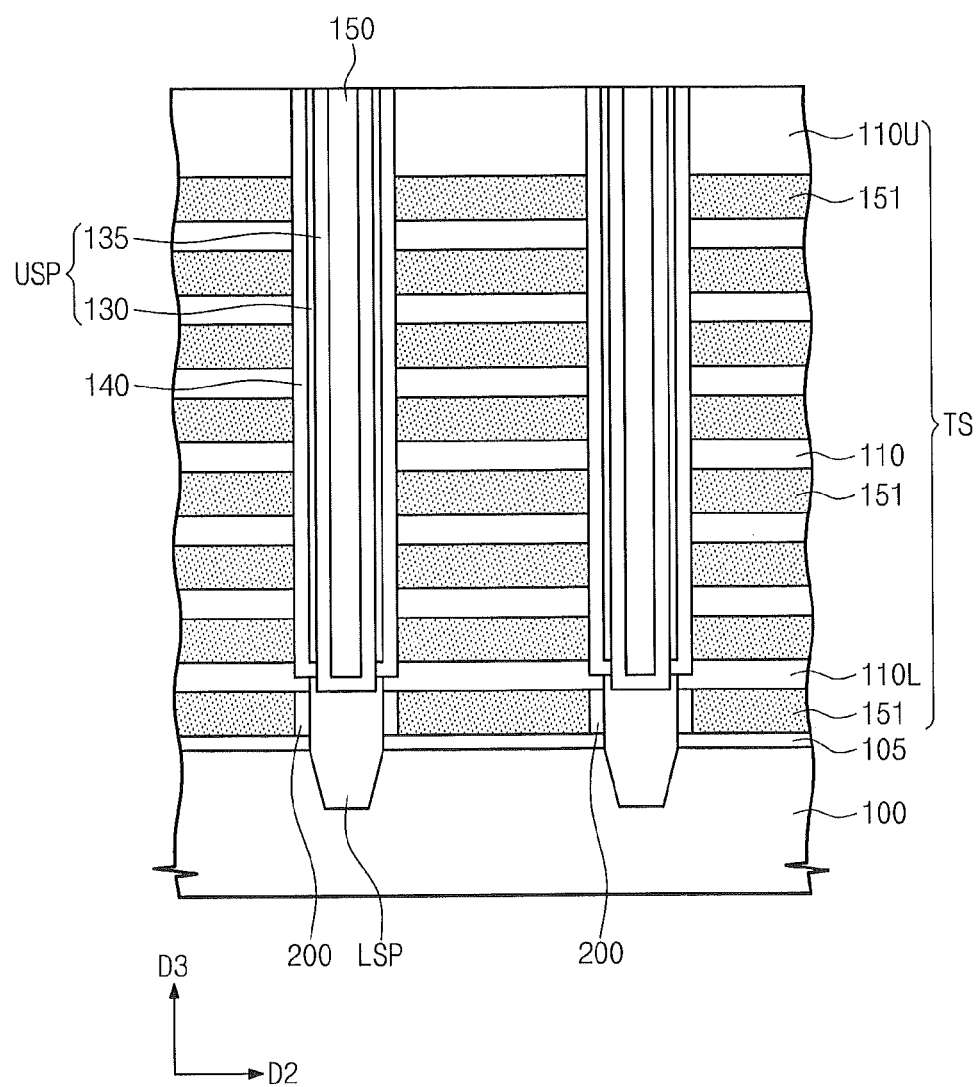

Referring to FIGS. 4 and 11, second semiconductor patterns 135 and filling insulation patterns 150 may be formed on the resultant structure having the vertical insulators 140 and the first semiconductor patterns 130.

In more detail, a second semiconductor layer and a filling insulation layer may be sequentially formed in the through-holes 180 having the vertical insulators 140 and the first semiconductor patterns 130. The second semiconductor layer may be conformally formed in the through-holes 180. Thus, the second semiconductor layer may not completely fill the through-holes 180. The second semiconductor layer may connect the lower semiconductor patterns LSP to the first semiconductor patterns 130. The second semiconductor layer may include a semiconductor material (e.g., poly-crystalline silicon, single-crystalline silicon, or amorphous silicon) formed using one of an ALD process or a CVD process. The filling insulation layer may completely fill the through-holes 180. The filling insulation layer may include at least one of insulating materials formed using a spin-on-glass (SOG) technique and a silicon oxide layer. Thereafter, the second semiconductor layer and the filling insulation layer may be planarized until the top surface of the thin layer structure TS is exposed, thereby confinedly forming the second semiconductor patterns 135 and the filling insulation patterns 150 in the through-holes 180.

Each of the second semiconductor patterns 135 may have a pipe-shape having one closed end, a hollow cylindrical shape having one closed end, or a cup-shape in each of the through-holes 180. Alternatively, each of the second semiconductor patterns 135 may have a pillar-shape filling each of the through-holes 180.

The filling insulation pattern 150 may be formed to fill an inner region of each through-hole 180 having the second semiconductor pattern 135.

As a result, an upper semiconductor pattern USP defined by the first and second semiconductor patterns 130 and 135 may be formed in each through-hole 180 (Block 60). The upper semiconductor patterns USP may be formed on the lower semiconductor patterns LSP, respectively.

Figure 12:
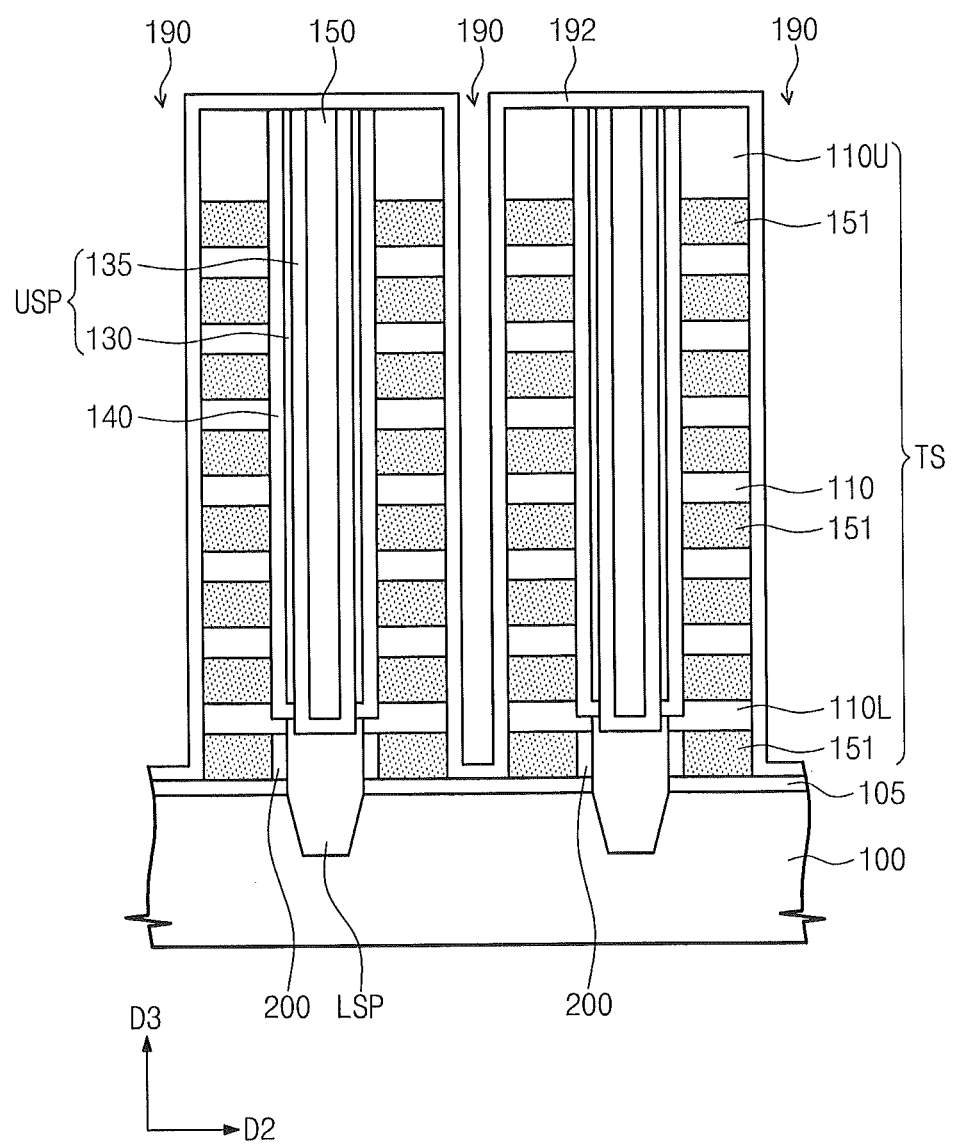

Referring to FIGS. 4 and 12, the thin layer structure TS may be patterned to form trenches 190 penetrating the thin layer structure TS between the through-holes 180 (Block 70).

In more detail, mask patterns defining positions of the trenches 190 may be formed on the thin layer structure TS and then the thin layer structure TS may be etched using the mask patterns as etch masks to form the trenches 190.

The trenches 190 may be spaced apart from each of the upper and lower semiconductor patterns USP and LSP to expose sidewalls of the gate layers 151 and the insulating layers 110L, 110 and 110U. The trenches 190 may have linear shapes or rectangular shapes when viewed from a plan view. The trenches 190 may expose a top surface of the lower insulating layer 105. In other words, the etching process for the formation of the trenches 190 may be performed using an etch recipe having an etch selectivity with respect to the lower insulating layer 105. Additionally, the etching process for the formation of the trenches 190 may be an anisotropic etching process, so that a width of each trench 190 may be varied according to a distance from the substrate 100.

Because the trenches 190 are formed, the thin layer structure TS between the trenches 190 adjacent each other may have a linear shape extending in one direction. A plurality of the upper semiconductor patterns USP may penetrate one thin layer structure TS having the linear shape.

After the formation of the trenches 190, a metal layer 192 may be formed on the thin layer structure TS. The metal layer 192 may partially fill the trenches 190. For example, the metal layer 192 may include titanium (Ti), nickel (Ni), cobalt (Co) and/or platinum (Pt). The metal layer 192 may be formed by performing an ALD process or a CVD process. Thereafter, an annealing process may be performed to react the metal layer 192 with the gate layers 151.

Figure 13:
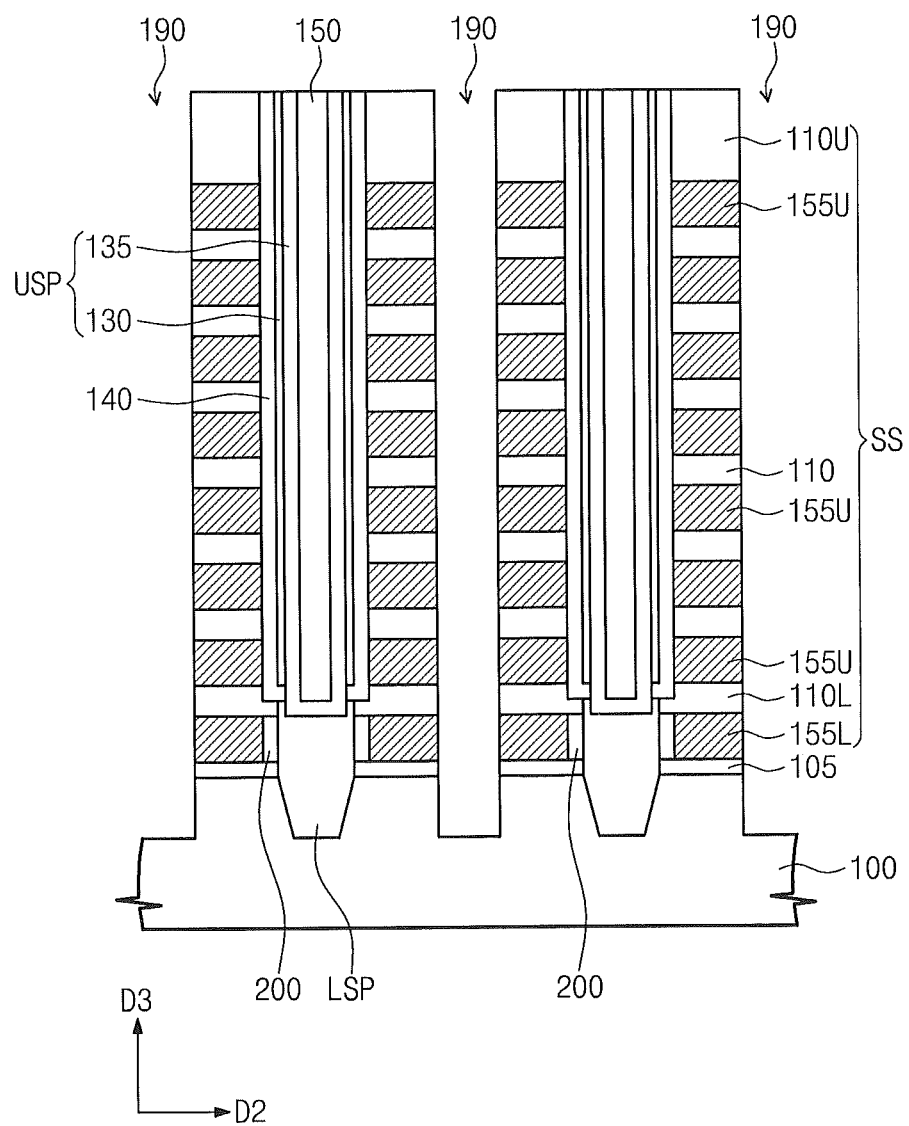

Referring to FIGS. 4 and 13, the gate layers 151 may react with the metal layer 192 by the annealing process to be changed into gate electrodes 155L and 155U (Block 80). The gate electrodes 155L and 155U may include lower gate electrodes 155L adjacent the lower semiconductor patterns LSP and upper gate electrodes 155U adjacent the upper semiconductor patterns USP. The gate electrodes 155L and 155U may be separated from each other by the insulating layers 110L, 110 and 110U. Stacked gate electrodes 155L and 155U and the insulating layers 110L, 110 and 110U disposed therebetween may constitute a stack structure SS.

The gate electrodes 155L and 155U may include a semiconductor-metal compound (e.g., a metal silicide) by the reaction process through the annealing process. An unreacted metal layer 192 may be removed. Thereafter, the lower insulating layer 105 may be etched to expose the substrate 100. In this case, the top surface of the substrate 100 under the trenches 190 may be recessed by a predetermined depth due to over-etching.

Figure 14:
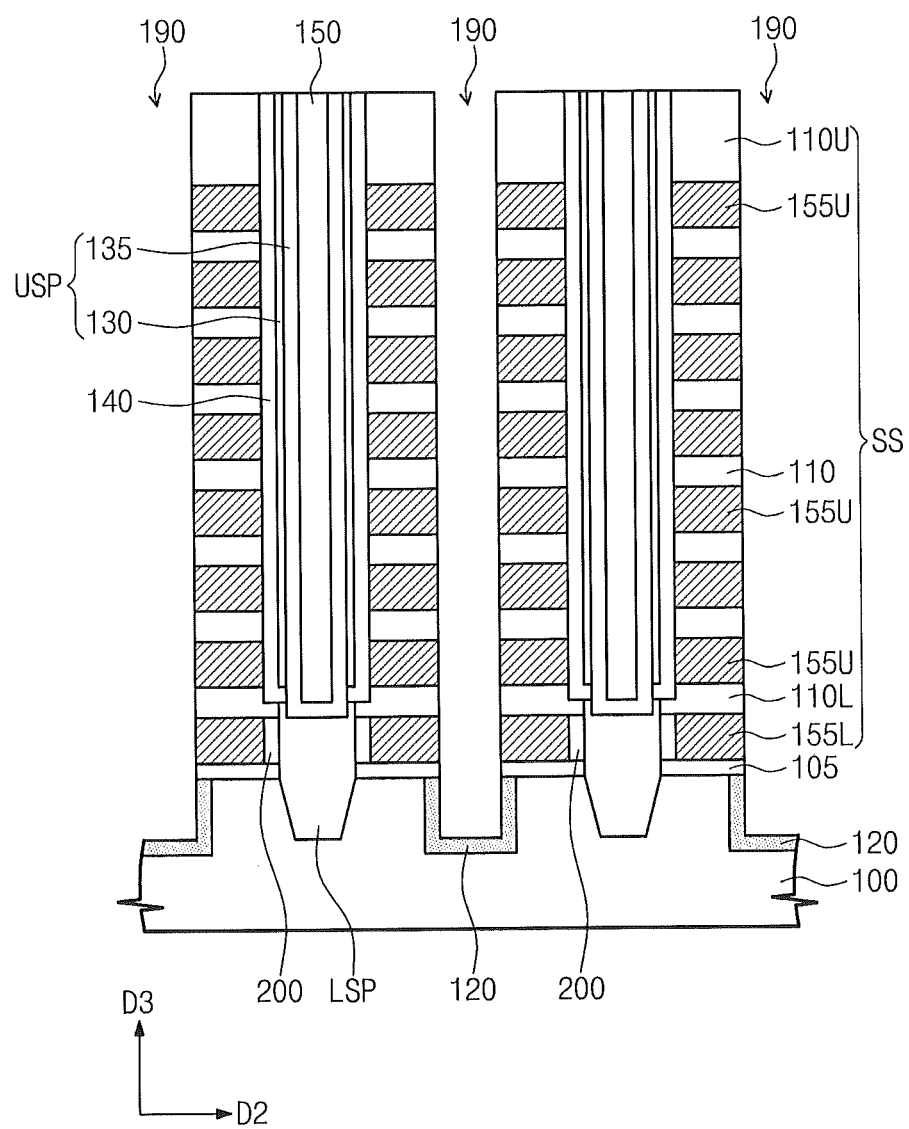

Referring to FIG. 14, common source regions 120 may be formed in the substrate 100 after the formation of the gate electrodes 155L and 155U. The common source regions 120 may be formed by an ion implantation process and may be formed in the substrate 100 exposed by the trenches 190. The common source regions 120 may have a different conductivity type from the lower semiconductor patterns LSP. The common source regions 120 and the substrate 100 may constitute PN junctions. Portions of the substrate 100 that contact the lower semiconductor patterns LSP may have the same conductivity type as the lower semiconductor patterns LSP. In some embodiments, the common source regions 120 may be connected to each other such that the common source regions 120 may be in an equipotential state. In some embodiments, the common source regions 120 may be electrically separated from each other such that the common source regions 120 may have different potentials from each other. In some embodiments, the common source regions 120 may be classified into a plurality of source groups and each of the source groups may include a plurality of the common source regions 120. The source groups may be electrically separated from each other such that the source groups may have different potentials from each other.

Figure 15:
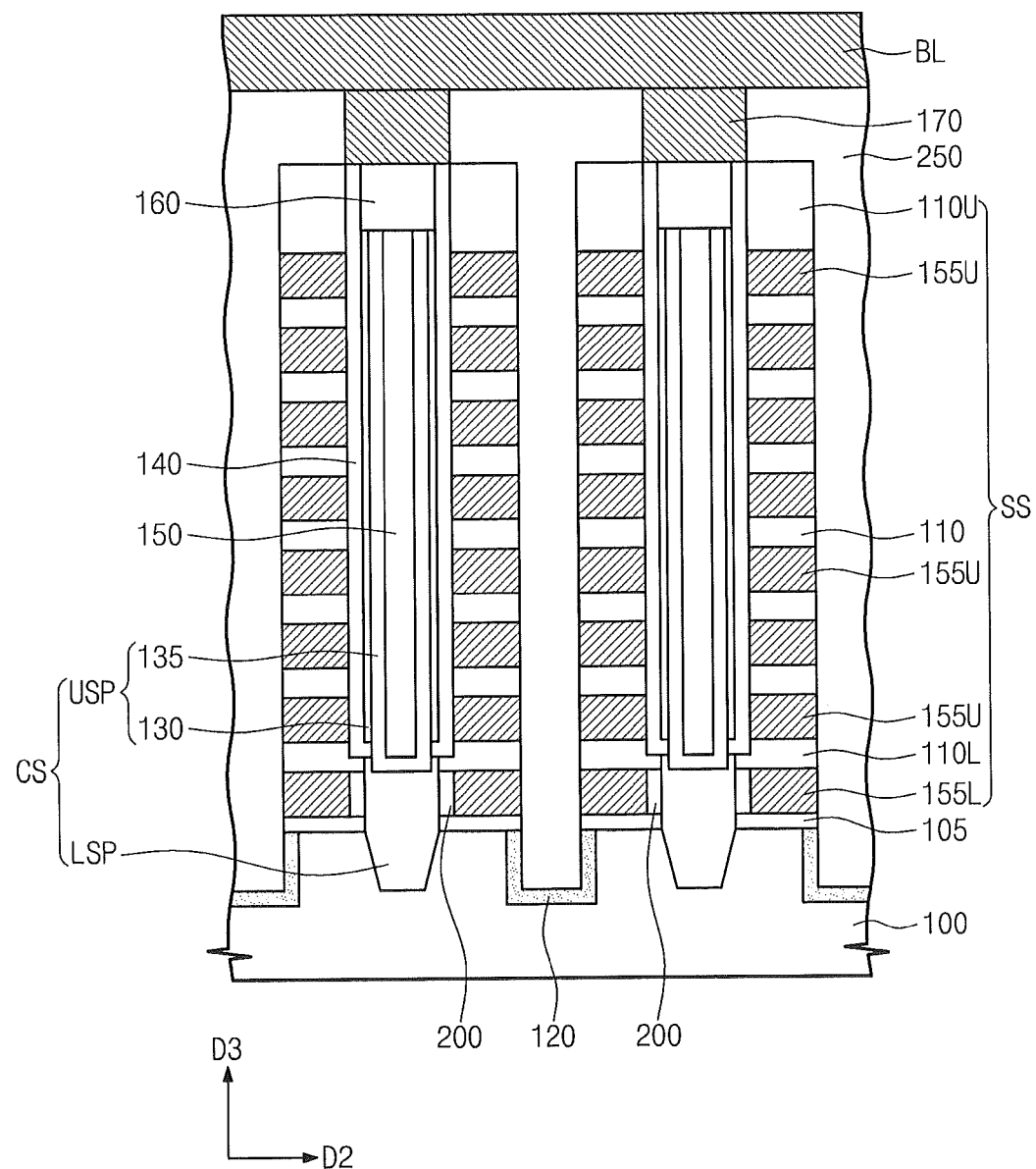

Referring to FIG. 15, an electrode isolation pattern 250 filling the trenches 190 may be formed on the common source regions 120. The electrode isolation pattern 250 may be formed of at least one of a silicon oxide layer, a silicon nitride layer, or a silicon oxynitride layer.

Additionally, conductive pads 160 may be formed to be connected to the first and second semiconductor patterns 130 and 135. Upper portions of the first and second semiconductor patterns 130 and 135 may be recessed and then a conductive material may be formed to fill the recessed regions. Thus, the conductive pads 160 may be formed. Each of the conductive patterns 160 may be doped with dopants of a different conductivity type from the first and second semiconductor patterns 130 and 135 thereunder.

Contact plugs 170 may be formed to be connected to the conductive pads 160, respectively. A bit line BL may be formed to be connected to the contact plugs 170. The bit line BL may be electrically connected to the first and second semiconductor patterns 130 and 135 through the contact plug 170. The bit line BL may cross over the lower and upper gate electrodes 155L and 155U.

According to some embodiments of the inventive concepts, the oxidation process may be performed to form the first and second patterns 200 and 210 having different thicknesses from each other at the same time and then the residual portions of the first patterns 200 may remain on the sidewalls of the gate layers 151 by/after the removal of the second patterns 210 and portions of the first patterns 200. The residual portions of the first patterns 200 may function as masks of the gate layers 151 during the SEG process for the formation of the lower semiconductor patterns LSP. The gate layers 151 may react with the metal layers 192 to be changed into the gate electrodes 155L and 155U. As a result, the gate electrodes 155L and 155U may be formed using the reaction process of the gate layers 151 and the metal layer 192, and the lower semiconductor patterns LSP may be formed using the SEG process, so that the manufacturing process of the 3D semiconductor memory device may be simplified.

Additionally, because the gate electrodes 155L and 155U are formed using the reaction process of the gate layers 151 and the metal layer 192, misalignment between the gate electrodes 155L and 155U may be reduced/prevented. Moreover, vertical thicknesses of the insulating layers 110L, 110, and 110U between the gate electrodes 155L and 155U may be reduced to realize a highly integrated 3D semiconductor memory device.

Figure 16:
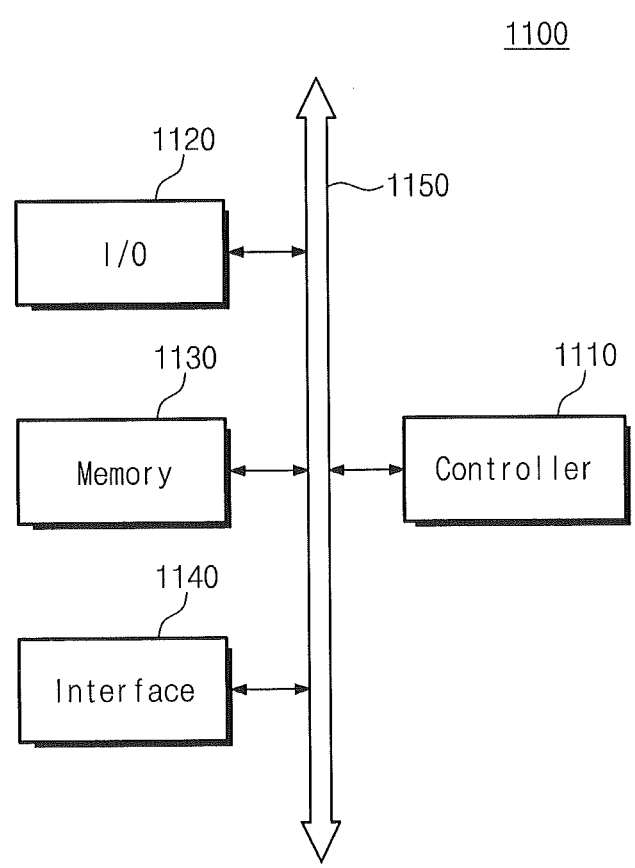
FIG. 16 is a schematic block diagram illustrating an example of electronic systems including three-dimensional semiconductor memory devices according to embodiments of the inventive concepts.

FIG. 16 is a schematic block diagram illustrating an example of electronic systems including three-dimensional semiconductor memory devices according to embodiments of the inventive concepts.

Referring to FIG. 16, an electronic system 1100 may be applied to a personal digital assistant (PDA), a portable computer, a web tablet, a wireless phone, a mobile phone, a digital music player, a memory card, or other electronic products configured to receive and/or transmit information data wirelessly.

The electronic system 1100 may include a controller 1110, an input/output (I/O) unit 1120 (e.g., a keypad, a keyboard, and/or a display), a memory device 1130, an interface unit 1140, and a data bus 1150. The memory device 1130 and the interface unit 1140 may communicate with each other through the data bus 1150.

The controller 1110 may include at least one of a microprocessor, a digital signal processor, a microcontroller, or other logic device having a similar function to any one thereof. The memory device 1130 may store data processed by the controller 1110. The I/O unit 1120 may receive data or signals from external to the electronic system 1100 or may output data or signals to the outside of the electronic system 1100.

The memory device 1130 may include at least one of the 3D semiconductor memory devices according to the aforementioned embodiments of the inventive concepts. Additionally, the memory device 1130 may further include at least one of another kind of a memory device, a random access volatile memory device, or various other kinds of memory devices.

The interface unit 1140 may transmit electrical data to a communication network or may receive electrical data from a communication network.

Figure 17:
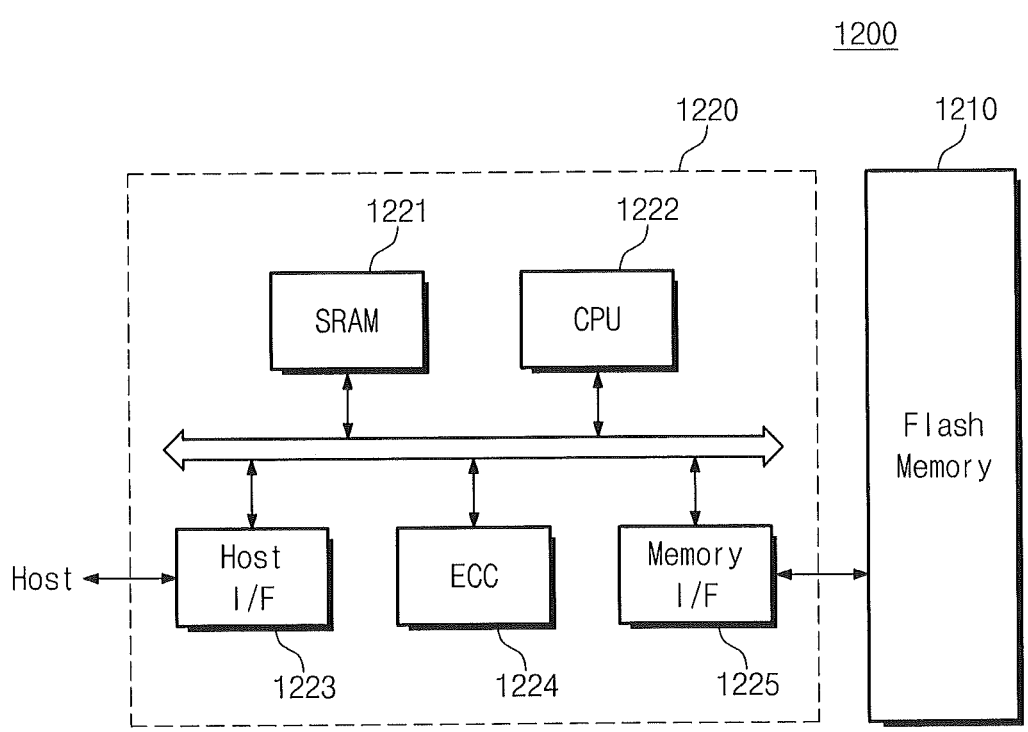
FIG. 17 is a schematic block diagram illustrating an example of memory systems including three-dimensional semiconductor memory devices according to embodiments of the inventive concepts.

FIG. 17 is a schematic block diagram illustrating an example of memory systems including three-dimensional semiconductor memory devices according to some embodiments of the inventive concepts.

Referring to FIG. 17, a memory system 1200 may include a flash memory device 1210 configured to store massive data. The flash memory device 1210 may include at least one of the 3D semiconductor memory devices according to the aforementioned embodiments of the inventive concepts. The memory system 1200 may include a memory controller 1220 that controls data communication between a host and the flash memory device 1210.

A static random access memory (SRAM) device 1221 may be used as an operating memory of a central processing unit (CPU) 1222. A host interface unit 1223 may be configured to include a data communication protocol between the memory system 1200 and the host. An error check and correction (ECC) block 1224 may detect and correct errors of data which are read out from the flash memory device 1210. A memory interface unit 1225 may interface with the flash memory device 1210 according to some embodiments of the inventive concepts. The CPU 1222 may perform overall operations for data exchange of the memory controller 1220. The memory system 1200 may further include a read only memory (ROM) device that stores code data to interface with the host.

The 3D semiconductor memory devices and the memory systems according to some embodiments of the inventive concepts may be encapsulated using various packaging techniques. For example, 3D semiconductor memory devices and the memory systems according to some embodiments of the inventive concepts may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

Figure 18:
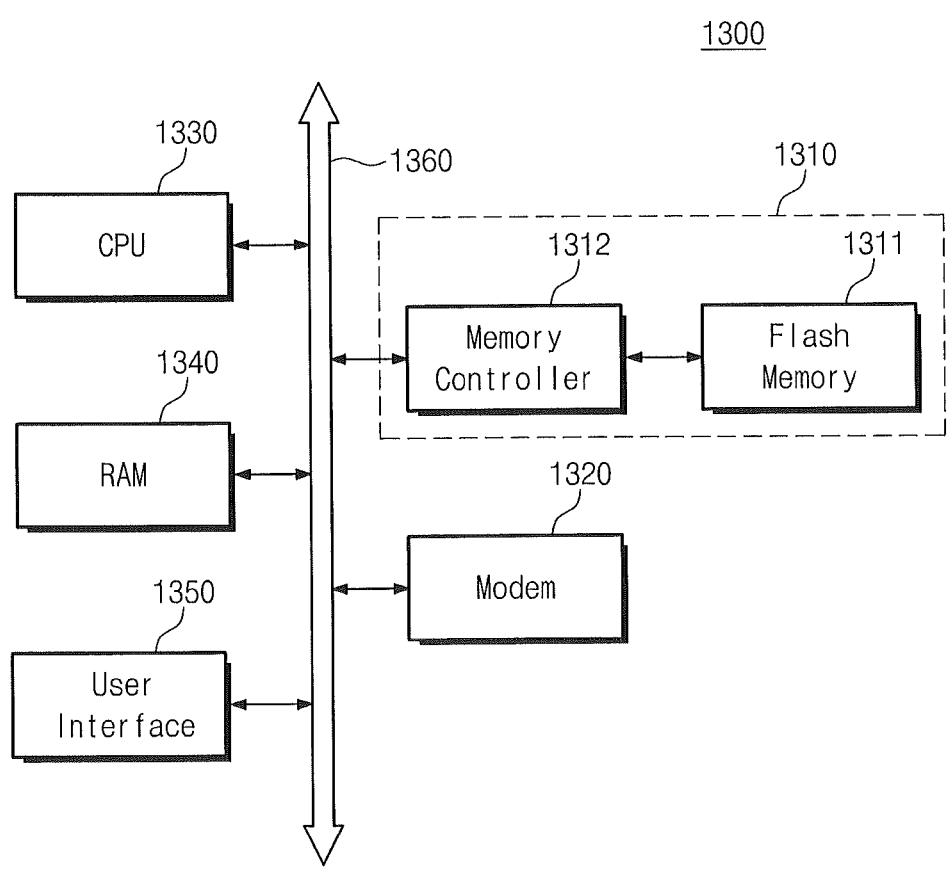
FIG. 18 is a schematic block diagram illustrating an example of information processing systems including three-dimensional semiconductor memory devices according to embodiments of the inventive concepts.

FIG. 18 is a schematic block diagram illustrating an example of information processing systems including three-dimensional semiconductor memory devices according to some embodiments of the inventive concepts.

Referring to FIG. 18, a flash memory system 1310 may be installed in an information processing system 1300 such as a mobile device or a desktop computer. The flash memory system 1310 may include a memory controller 1312 and a flash memory device 1311. The flash memory device 1311 may include at least one of the 3D semiconductor memory devices according to the above embodiments of the inventive concepts. The information processing system 1300 according to some embodiments of the inventive concepts may include a modem 1320, a central processing unit (CPU) 1330, a random access memory (RAM) 1340, and a user interface unit 1350 that are electrically connected to the flash memory system 1310 through a system bus 1360. The flash memory system 1310 may be substantially the same as the aforementioned memory system or flash memory system. Data processed by the CPU 1330 or data input from external to the information processing system 1300 may be stored in the flash memory system 1310. Here, the flash memory system 1310 may be realized as a solid state disk (SSD) device. In this case, the information processing system 1300 may stably store massive data in the flash memory system 1310. Additionally, as reliability of the flash memory system 1310 may increase, the flash memory system 1310 may reduce a resource consumed for correcting errors. An application chipset, a camera image processor (CIS), and/or an input/output unit may further be provided in the information processing system 1300.

According to some embodiments of the inventive concepts, manufacturing processes of a 3D semiconductor device may be simplified.

According to some embodiments of the inventive concepts, misalignment of vertically stacked gate electrodes may be prevented. Additionally, highly integrated 3D semiconductor memory device may be realized.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A method of manufacturing a semiconductor device, the method comprising:
   forming a thin layer structure comprising insulating layers and gate layers alternately and repeatedly stacked on a substrate;
   forming through-holes that penetrate the thin layer structure and expose portions of the substrate;
   forming first patterns on sidewalls of the gate layers that are exposed by the through-holes, by performing an oxidation process;
   forming second patterns on the portions of the substrate that are exposed by the through-holes, by performing the oxidation process;
   removing the second patterns; and
   forming lower semiconductor patterns in lower regions of the through-holes after removing the second patterns.

2. The method of claim 1,
   wherein forming the first patterns comprises oxidizing portions of the gate layers, and
   wherein forming the second patterns comprises oxidizing the portions of the substrate that are exposed by the through-holes.

3. The method of claim 2,
   wherein each of the first patterns comprises:
      a first sidewall contacting a respective one of the gate layers; and
      a second sidewall opposite the first sidewall,
   wherein a first thickness of each of the first patterns is defined as a distance between the first and second sidewalls,
   wherein each of the second patterns comprises:
      a first surface contacting the substrate; and
      a second surface opposite the first surface,
   wherein a second thickness of each of the second patterns is defined as a distance between the first and second surfaces, and
   wherein the first thickness is thicker than the second thickness.

4. The method of claim 1,
   wherein removing the second patterns comprises performing a dry or wet etching process to remove the second patterns and portions of the first patterns, and
   wherein residual portions of the first patterns are on the gate layers after the dry or wet etching process.

5. The method of claim 4, wherein forming the lower semiconductor patterns comprises:
   performing a selective epitaxial growth (SEG) process on portions of the substrate that are exposed by removing the second patterns.

6. The method of claim 5, wherein:
   each of the lower semiconductor patterns covers at least one of the residual portions of the first patterns; and
   the method further comprises:
      removing ones of the residual portions of the first patterns that are not covered by the lower semiconductor patterns; and
      forming a vertical insulator and an upper semiconductor pattern in an upper region of each of the through-holes.

7. The method of claim 1,
   wherein forming the thin layer structure comprises alternately and repeatedly depositing the insulating layers and the gate layers, and
   wherein the method further comprises injecting impurities into each of the gate layers concurrently with depositing the gate layers.

8. The method of claim 7, wherein the impurities comprise a Group III element, a Group V element, or a combination of the Group III element and the Group V element.

9. The method of claim 8, wherein the impurities comprise carbon.

10. The method of claim 1, wherein the gate layers comprise silicon.

11. The method of claim 10, further comprising forming gate electrodes using the gate layers, by:
    patterning the thin layer structure to form trenches spaced apart from the through-holes;
    forming a metal layer in the trenches;
    performing an annealing process to react the gate layers with the metal layer; and
    removing unreacted portions of the metal layer.

12. A method of forming a semiconductor device, the method comprising:
    forming a structure comprising insulating layers and gate layers alternately and repeatedly stacked on a substrate;
    forming through-holes in the structure;
    performing an oxidation process to form first patterns on respective sidewalls of the gate layers and to form second patterns on respective portions of the substrate;
    removing the second patterns; and
    forming semiconductor patterns in the through-holes after removing the second patterns.

13. The method of claim 12,
    wherein performing the oxidation process comprises oxidizing the sidewalls of the gate layers and oxidizing the portions of the substrate, to form the first and second patterns to first and second thicknesses, respectively,
    wherein the first thickness of the first patterns is thicker than the second thickness of the second patterns.

14. The method of claim 13, wherein removing the second patterns comprises:
    removing the second patterns from the substrate; and
    reducing the first thickness of first patterns to provide a reduced first thickness of the first patterns on the gate layers.

15. The method of claim 14, wherein forming the semiconductor patterns comprises:
    forming the semiconductor patterns on the substrate, using the reduced first thickness of the first patterns on the gate layers as a mask for the gate layers.

16. The method of claim 15, further comprising:
    forming gate electrodes by reacting a metal with the gate layers after removing the second patterns.

17. The method of claim 16, wherein the gate layers comprise at least one impurity, and wherein oxidizing the sidewalls of the gate layers comprises oxidizing the gate layers comprising the at least one impurity, to form the first patterns comprising the first thickness that is thicker than the second thickness of the second patterns.

18. A method of forming a semiconductor device, the method comprising:

forming a structure comprising insulating layers and gate layers that are alternately and repeatedly stacked on a substrate;

forming through-holes in the structure;

performing an oxidation process that concurrently oxidizes sidewalls of the gate layers and portions of the substrate, to form respective first patterns on the sidewalls of the gate layers to a first thickness that is thicker than a second thickness to which the oxidation process forms respective second patterns on the portions of the substrate;

removing the second patterns from the substrate while reducing the first thickness of first patterns to provide a reduced first thickness of the first patterns on the gate layers; and forming semiconductor patterns on the substrate, using the reduced first thickness of the first patterns on the gate layers as a mask for the gate layers.

19. The method of claim 18, further comprising forming gate electrodes by reacting a metal with the gate layers, wherein the gate layers comprise at least one impurity, and wherein oxidizing the sidewalls of the gate layers comprises oxidizing the gate layers comprising the at least one impurity to form the first patterns comprising the first thickness that is thicker than the second thickness of the second patterns.

20. The method of claim 19, further comprising:

forming a trench in the structure;

forming the metal in the trench; and forming an insulator on the structure and adjacent one of the semiconductor patterns, before forming the trench in the structure.

* * * * *